US009881659B2

(12) United States Patent
Shigeki et al.

(10) Patent No.: US 9,881,659 B2
(45) Date of Patent: Jan. 30, 2018

(54) TECHNOLOGIES FOR CLEARING A PAGE OF MEMORY

(71) Applicant: Intel Corporation, Santa Clara, CA (US)

(72) Inventors: Tomishima Shigeki, Portland, OR (US); Kuljit S. Bains, Olympia, WA (US); Tomer Levy, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/866,579

(22) Filed: Sep. 25, 2015

(65) Prior Publication Data

US 2017/0092342 A1   Mar. 30, 2017

(51) Int. Cl.
*G11C 8/10*    (2006.01)
*G11C 7/22*    (2006.01)
*G11C 7/10*    (2006.01)
*G11C 7/12*    (2006.01)
*G11C 8/12*    (2006.01)

(52) U.S. Cl.
CPC ............. *G11C 7/22* (2013.01); *G11C 7/106* (2013.01); *G11C 7/1087* (2013.01); *G11C 7/12* (2013.01); *G11C 8/10* (2013.01); *G11C 8/12* (2013.01)

(58) Field of Classification Search
CPC .......... G11C 7/22; G11C 7/1087; G11C 8/12; G11C 7/12; G11C 8/10; G11C 7/106
See application file for complete search history.

(56) References Cited

U.S. PATENT DOCUMENTS

| 5,381,368 A | 1/1995 | Morgan et al. |
|---|---|---|
| 5,440,517 A | 8/1995 | Morgan et al. |
| 5,625,601 A | 4/1997 | Gillingham et al. |
| 5,765,184 A * | 6/1998 | Durante ............... G11C 16/102 365/185.29 |
| 5,854,771 A | 12/1998 | Mori |
| 5,886,944 A | 3/1999 | Ahn |
| 6,289,413 B1 | 9/2001 | Rogers et al. |
| 6,449,204 B1 | 9/2002 | Arimoto |
| 2001/0008498 A1 | 7/2001 | Ooishi |
| 2001/0015926 A1* | 8/2001 | Kato ....................... G11C 29/50 365/201 |
| 2002/0015350 A1 | 2/2002 | Tomishia et al. |
| 2003/0103368 A1 | 6/2003 | Arimoto |

(Continued)

OTHER PUBLICATIONS

International search report for PCT application No. PCT/US2016/048596, dated Dec. 21, 2016 (3 pages).

(Continued)

*Primary Examiner* — Khamdan Alrobaie
(74) *Attorney, Agent, or Firm* — Barnes & Thornburg LLP

(57) ABSTRACT

Technologies for clearing a page of memory include a memory device configured write a value to a block of memory cells in response to an activation signal. The memory device includes a row decoder responsive to a memory address to select a row of memory cells and a column decoder responsive to the activation signal to select one or more columns of memory cells. Additionally, a write driver of the memory device is configured to write a value to global input/output lines, which are connected to the selected memory cells in response to the activation signal and regardless of data received on a data input of the write driver.

23 Claims, 15 Drawing Sheets

(56) References Cited

U.S. PATENT DOCUMENTS

| | | | |
|---|---|---|---|
| 2004/0218444 | A1 | 11/2004 | Sawhney |
| 2006/0233013 | A1 | 10/2006 | Tu et al. |
| 2009/0279351 | A1 | 11/2009 | Park et al. |
| 2010/0110771 | A1 | 5/2010 | Choi |
| 2010/0149894 | A1 | 6/2010 | Mochida |
| 2010/0157693 | A1 | 6/2010 | Iwai |
| 2010/0232199 | A1* | 9/2010 | Maejima ............... G11C 8/08 365/51 |
| 2011/0157982 | A1* | 6/2011 | Lee ................ G11C 16/0425 365/185.03 |
| 2011/0205789 | A1 | 8/2011 | Kim |
| 2014/0059285 | A1 | 2/2014 | Kim et al. |
| 2014/0173234 | A1 | 6/2014 | Jung et al. |
| 2014/0177347 | A1 | 6/2014 | Chatterjee et al. |
| 2016/0284390 | A1 | 9/2016 | Tomishima |

OTHER PUBLICATIONS

Written opinion for PCT application No. PCT/US2016/048596, dated Dec. 21, 2016 (11 pages).
Office action and search report for Taiwan Patent Application No. 105101888, dated Feb. 20, 2017 (14 pages including machine translation).
International search report for PCT application PCT/US2016/17226, dated Jun. 3, 2016 (3 pages).
Written opinion for PCT application PCT/US2016/17226, dated Jun. 3, 2016 (7 pages).
Vivek Seshadri et al., "RowClone: Fast and Energy-Efficient In-DRAM Bulk Data Copy and Initialization," MICRO-46 Proceeding of the 46th Institute for Electrical and Electronics Engineers Annual Association for Computing Machinery (ACM) IEEE/ACM International Symposium Microarchitecture, pp. 185-197 (published Dec. 7, 2013).

* cited by examiner

TECHNOLOGIES FOR CLEARING A PAGE OF MEMORY

BACKGROUND

Memory devices, such as memory integrated circuits, are used to store data. Memory devices may be embodied as non-volatile memory in which the data is stored in a persistent manner or as volatile memory in which the data is stored until removal of power from the memory device. Oftentimes, memory devices form a sub-component of a larger computing system or electrical device. For example, memory devices may be incorporated in computers, solid state drives, portable memory systems, and/or the like.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
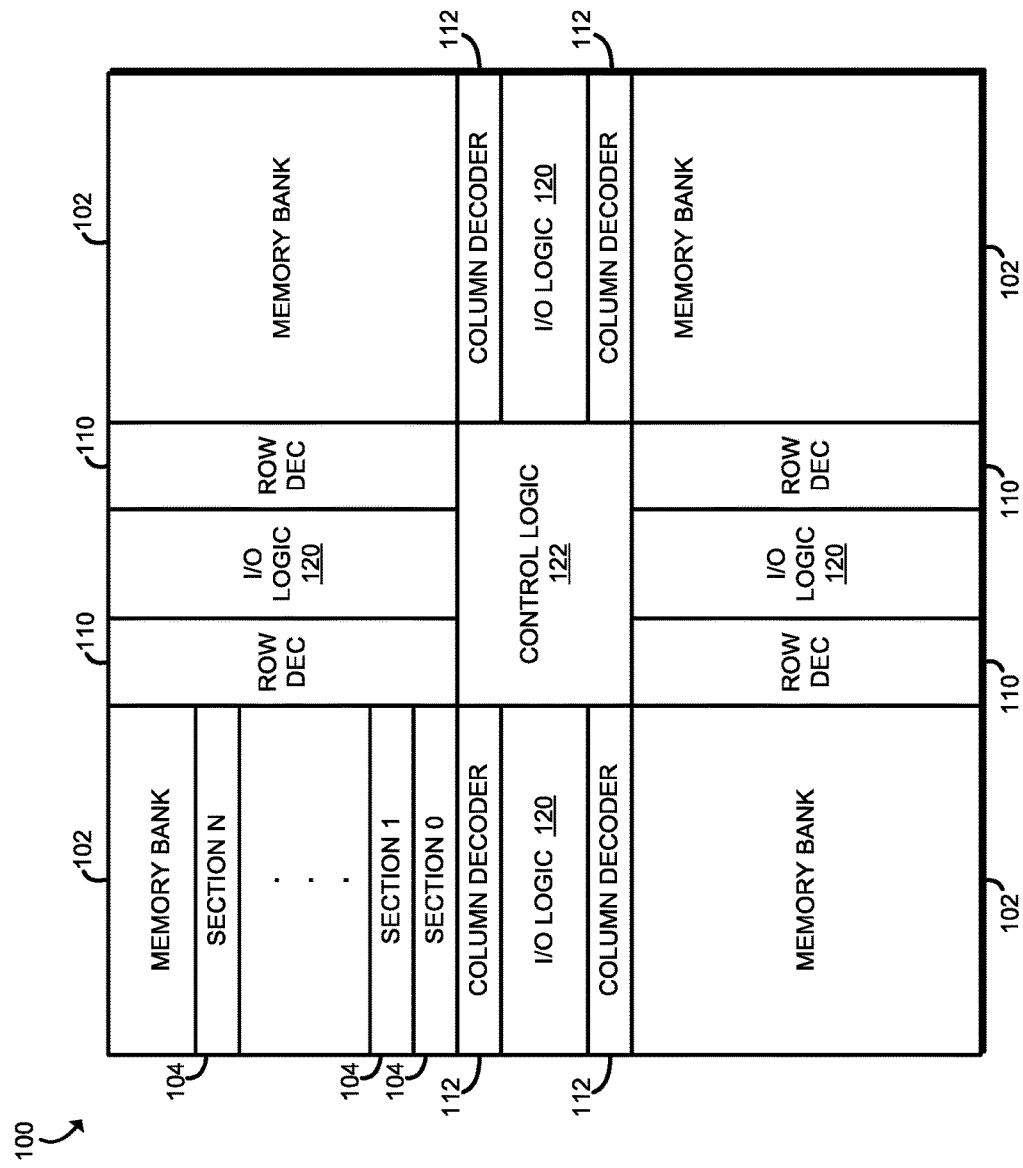
FIG. 1 is a simplified block diagram of at least one embodiment of a memory device including technologies for clearing a page of memory.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Many software and lower-level applications require the clearing of blocks of memory at various times during execution. Typically, a block of memory is cleared by use of one or more high-level software functions, such as Memset( ) and callloc( ) instructions of the C++ programming language. To clear multiple blocks of memory (e.g., a whole page), such instructions are typically inserted into a loop that reiterates the instruction many times (e.g., 128 loops). Using such instructions can be process intensive as the command and data bus are kept busy writing to multiple blocks of memory in sequence.

FIG. 1 shows a memory device 100 capability of clearing a page of memory based on a single instruction and/or activation signal. The illustrative memory device 100 includes multiple memory banks 102, and each memory bank 102 includes an array of memory cells arranged in rows and columns. As illustratively shown in the top left memory bank 102, the memory cells of each memory bank 102 may be grouped into different sections or rows 104, and each section 104 may be further divided into multiple memory tiles 202 of memory cells (see FIG. 2). Depending on the particular memory capacity of the memory device 100, each memory bank 102 may include one or more sections 104 having one or more rows of memory cells. Additionally, each row of memory cells may include a total number of memory cells that is defined by the overall memory capacity of the memory device 100. In the illustrative embodiment, each row of the memory device 100 includes from 16,000 to 64,000 individual memory cells (i.e., bits of memory), but may include a fewer or greater number of memory cells in other embodiments.

The illustrative memory device 100 also includes a row decoder 110 and a column decoder 112 associated with each memory bank 102. Each memory tile 202 (see FIG. 2) of a particular memory bank 102 may share the same row decoder 110 and column decoder 112. During standard operation, the row and column decoders 110, 112 are configured to decode a memory address to select a specific memory cell or collection of memory cells identified by the memory address. However, as discussed in more detail below, the memory device 100 is also configured to select every column in some embodiments, regardless of the column address and in response to an associated activation signal. In this way, the memory device 100 is configured to write to a page of memory via a single instruction (e.g., to clear the page of memory). Alternatively, in other embodiments, the memory device 100 is configured to clear one or more selected columns of memory via a single instruction. Although the technologies described below are directed to the writing of a logic zero to the page or selected columns of memory, it should be appreciated that such technologies may be used to write other values to a page and/or columns of the memory device 100 via a signal instruction or command. It should be appreciated that issuing a signal instruction or command to cause multiple writes can help lower power consumption and/or can free up the data bus to be used for other transitions.

The memory device 100 also includes input/output logic 120 associated with the row and column decoders 110, 112. Each input/output logic 120 includes additional support circuitry and/or components to facilitate the addressing function of the row and column decoders 110, 112 and the data flow into and out of the associated memory cells. The illustrative memory device 100 further includes control logic 122, which may include additional circuits and components to control the operation of the memory device 100 as discussed in more detail below.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device, for such devices that have a bank group architecture. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory device. In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Figure 2:
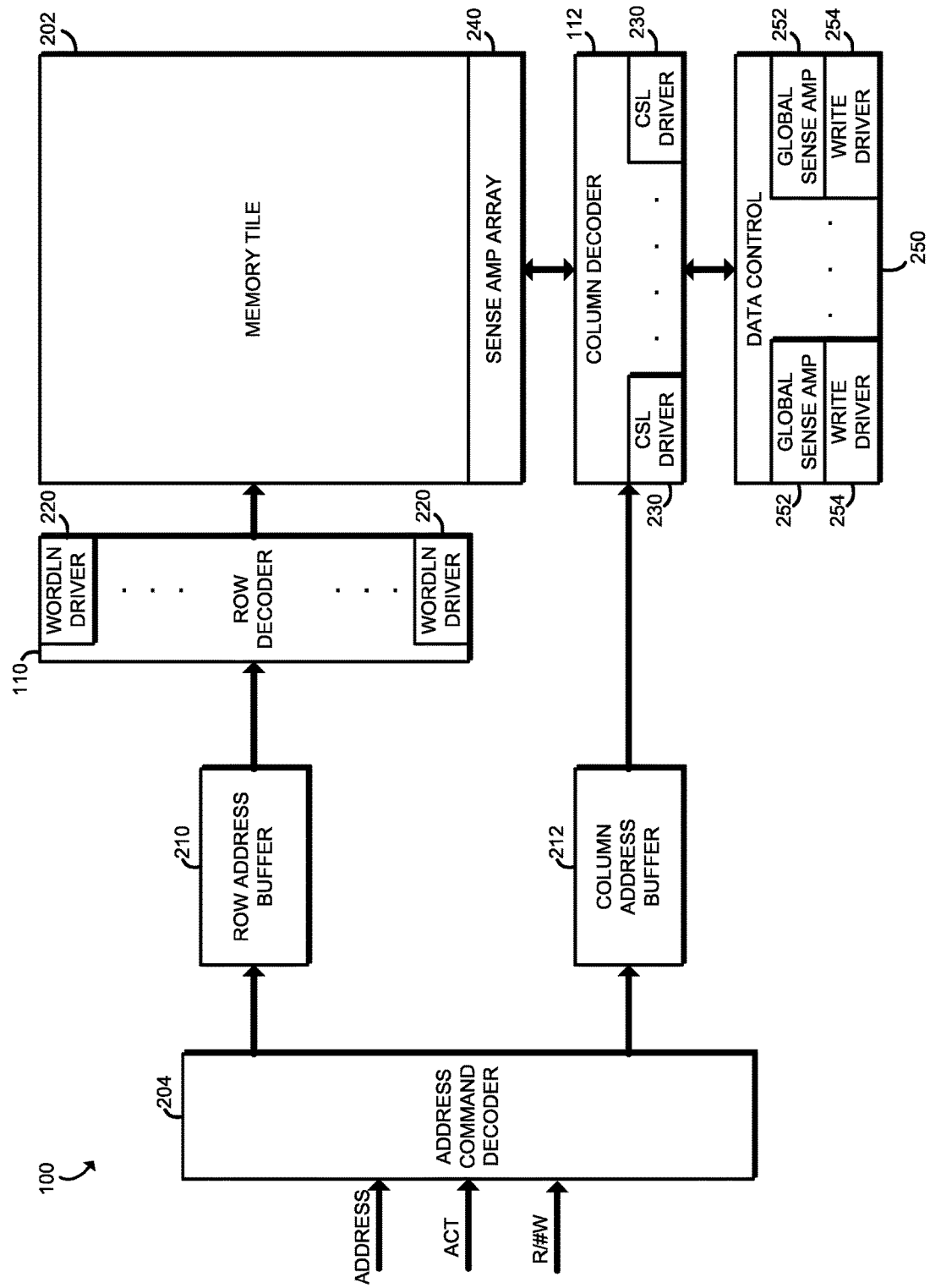
FIG. 2 is a simplified block diagram of at least one embodiment of a memory tile and associated control circuitry of the memory device of FIG. 1.
Figure 9:
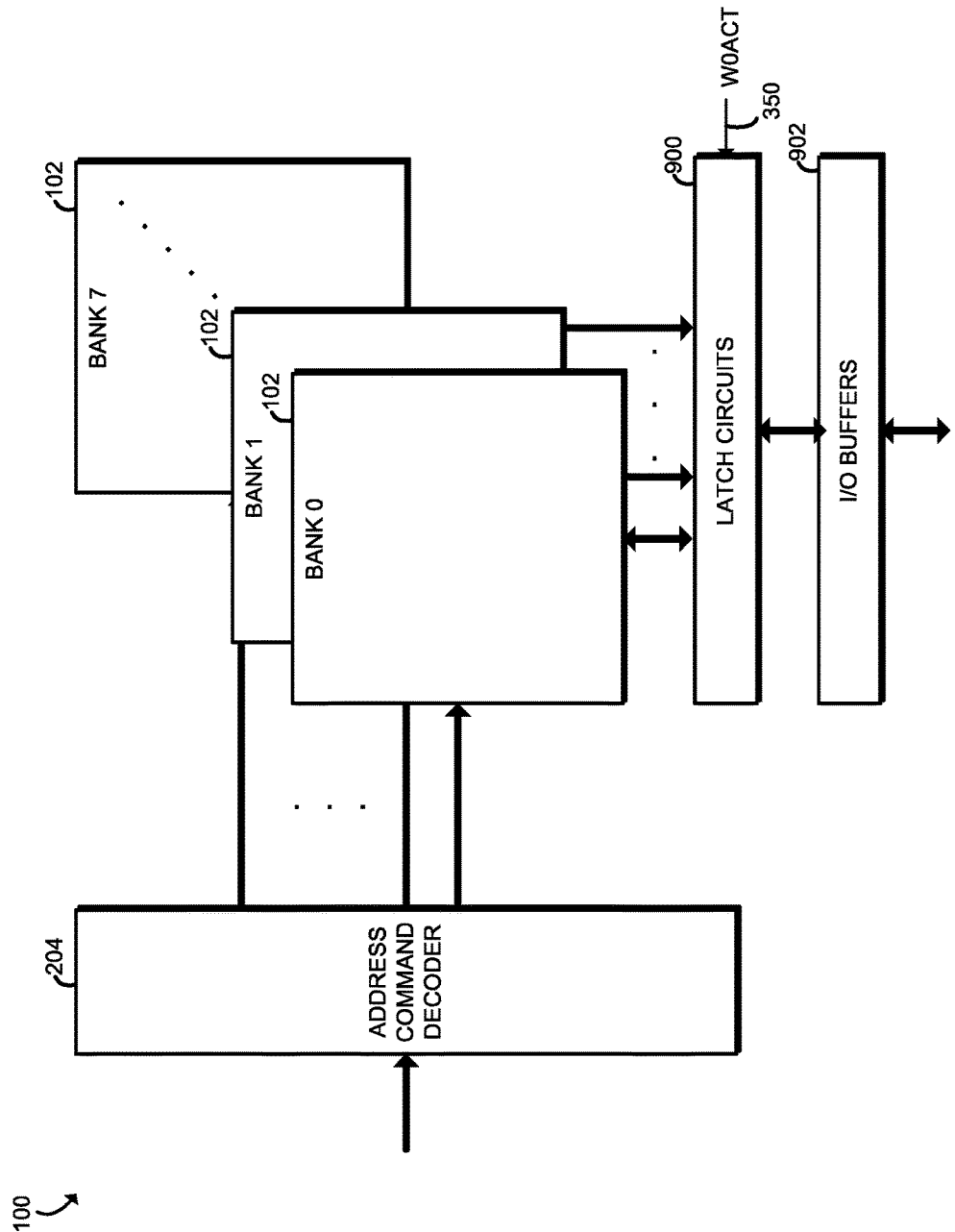
FIG. 9 is a block diagram of at least one embodiment of the memory device of FIGS. 1-4 including multiple memory banks.

Referring now to FIG. 2, as discussed above, each section 104 of each memory bank 102 includes one or more memory tiles 202 of memory cells arranged in rows and columns. To access a particular word of data (i.e., an associated collection of memory cells or bits) of the memory tile 202, an address is generated that includes the row address and column address, which combined define the location of the word of data in the memory array of the associated memory tile 202. That is, the address includes a portion of data that defines the row address and a portion of data that defines the column address. Of course, the address may include other data in some embodiments such as data that identifies the section 104 and the memory bank 102 (e.g., multiple memory banks 102 may be access in parallel as shown in FIG. 9). The address is received by an address command decoder 204, which may form part of the input/output logic 120 and/or the control logic 122, and is configured to predecode or separate the received address into the row address and the column address. The address command decoder 204 also receives one or more command signals that control operation of the memory device 100 such as an activation (ACT) signal, a clear page activation (W0ACT) signal, a read/write (R/#W) signal, and/or other command signals.

The row address determined by the address command decoder 204 from the received address is stored in a row address buffer or latch 210, and the column address is stored in a column address buffer or latch 212. The row address buffer 210 and the column address buffer 212 store the respective row and column address portions to facilitate the decoding of the respective row and column addresses into individual row and column selection signals as discussed below.

As shown in FIG. 2, the row decoder 110 includes a number of word line driver circuits 220. Each word line driver 220 is configured to assert or activate a corresponding word line to select a row of memory cells of the memory tile 202 in response to the row address matching the row controlled by the particular word line driver 220. That is, each word line driver 220 includes a collection of logical components (e.g., logic gates) configured to generate a row selection output signal to select a row of memory cells of the memory tile 202 in response to the row address matching an associated logic input for which the particular word line driver 220 is configured to assert.

Similarly, the column decoder 112 includes a number of column select line driver circuits 230. Each column select line driver 230 is configured to assert or activate a corresponding column select line to select a column of memory cells of the memory tile 202 in response to the column address matching the column controlled by the particular column select line drivers 230. That is, each column select line driver 230 includes a collection of logical components (see, e.g., FIG. 6) configured to generate a column selection output signal to select a column of memory cells of the memory tile 202 in response to the column address matching an associated logic input for which the particular column select line drivers 230 is configured to assert.

It should be appreciated that the number of individual columns selected by a given column address may depend on the particular word length of the memory tile 202 as discussed in more detail below. As such, the row decoder 110 and the column decoder 112 cooperate to select a data word of memory tile 202. Data retrieved from or sent to the individual memory cells of the accessed data word are buffered via a sense amplifier array 240. The sense amplifier array 240 includes a plurality of sense amplifiers, with each column of the memory tile 202 being coupled to at least one sense amplifier of the sense amplifier array 240.

The memory device 100 also includes data control circuitry 250, which may be included in the control logic 122 and/or input/output logic 120 and is configured to control the data flow into and out of the memory tile 202. The data control circuitry includes a number of global sense amplifiers 252 and a corresponding number of write drivers 254. Each global sense amplifier 252 is communicatively coupled to a corresponding set of global input/output lines (GIO<0 . . . n>), which are in turn communicatively coupled to a set of local input/output lines (LIO<0 . . . n>) associated with each corresponding memory tile 202 (see, e.g., FIG. 3). The individual sets of local input/output lines (LIO<0 . . . n>) are selectively coupled to individual memory cells of the memory tile 202 via the column select line drivers 230. In this way, data may be written to or retrieved from the selected memory cells of the memory tile 202 via the local input/output lines (LIO<0 . . . n>) and associated global input/output lines (GIO<0 . . . n>). Such data is buffered by the corresponding global sense amplifiers 252 in a manner similar to the sense amplifiers of the sense amplifier array 240. Additionally, the write drivers 254 control the writing of data onto the global input/output lines (GIO<0 . . . n>) and, subsequently, to the addressed memory cells via the corresponding local input/output lines (LIO<0 . . . n>).

Figure 3:
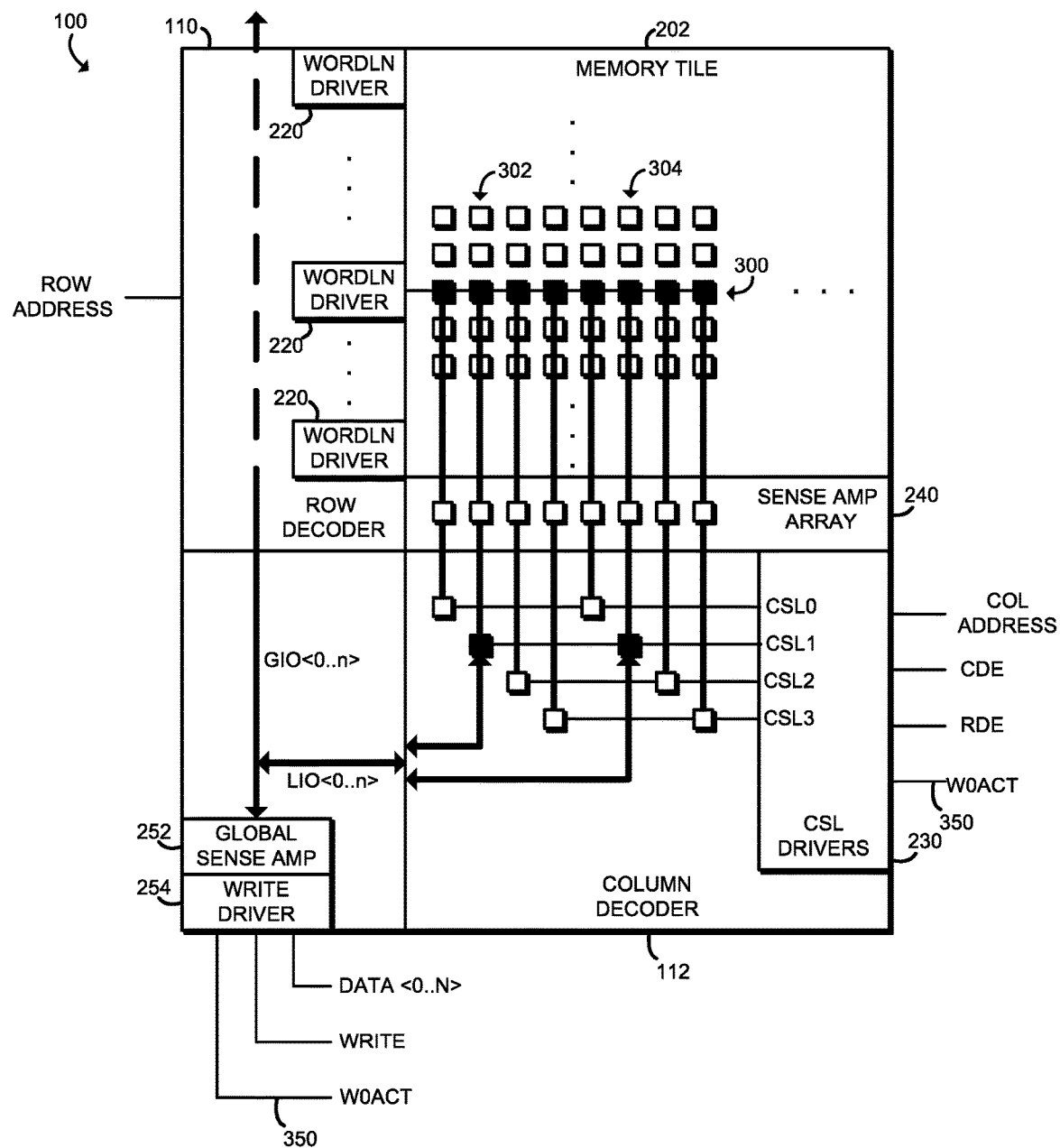
FIG. 3 is a simplified block diagram of the memory tile and associated control circuitry of memory device of FIG. 2 during standard operation.

Referring now to FIG. 3, during a standard writing operation, the write drivers 254 receive data (Data<0 . . . n>) to be written to a particular address of the memory tile 202 and place the data on the global input/output lines (GIO<0 . . . n>). The data to be written is subsequently supplied to the local input/output lines (LIO<0 . . . n>) of the addressed memory tile 202 via the global input/output lines (GIO<0 . . . n>).

The memory address of the memory tile 202 to which the data is to be written is decoded by the row decoder 110 and the column decoder 112 discussed above. During a standard addressing operation, the row decoder 110 associated with an addressed memory tile 202 decodes the row address to select the appropriate row identified by the present row address. To do so, each word line driver 220 receives the decoded, or partially decoded, row address and asserts or activates the associated word line if the logical input represented by the decoded row address matches a reference logical input (i.e., if the decoded row address matches the address of the row driven by the corresponding word line driver 220). For example, in the illustrative embodiment of FIG. 3, a row 300 of the memory tile 202 has been selected and asserted by a corresponding word line driver 220 in response to a matching row address. The selected row of memory cells is illustrated in FIG. 3 as shaded boxes.

Similar to the row decoder 110, the column decoder 112 associated with the addressed memory title 202 decodes, during a standard addressing operation, the column address to select the appropriate column (i.e., the set of columns defining the data word of the memory tile 202) identified by the present column address. To do so, each column select line driver 230 receives the decoded, or partially decoded, column address and asserts or activates the associated column select line (e.g., CSL0-CSL3 in FIG. 3) if the logical input represented by the decoded row address matches a reference logical input (i.e., if the decoded column address matches the address of the column driven by the corresponding column select line driver 230). For example, in the illustrative embodiment of FIG. 3, column 1 has been selected and, as such, the associated column select line (CSL1) has been selected and asserted by a corresponding column select line driver 230 in response to a matching column address. The assertion of the associated column select line (CSL1) assets or selects each individual bit column of the data word of the memory tile 202. For example, two individual bit columns corresponding to column 1 are selected in FIG. 3 as indicated by the shaded boxes. As such, any data placed on the global input/output lines (GIO<0 . . . n>) by the associated write drivers 254 is written to the memory cells selected by the associated word line driver 220 and the column select line driver 230.

Figure 4:
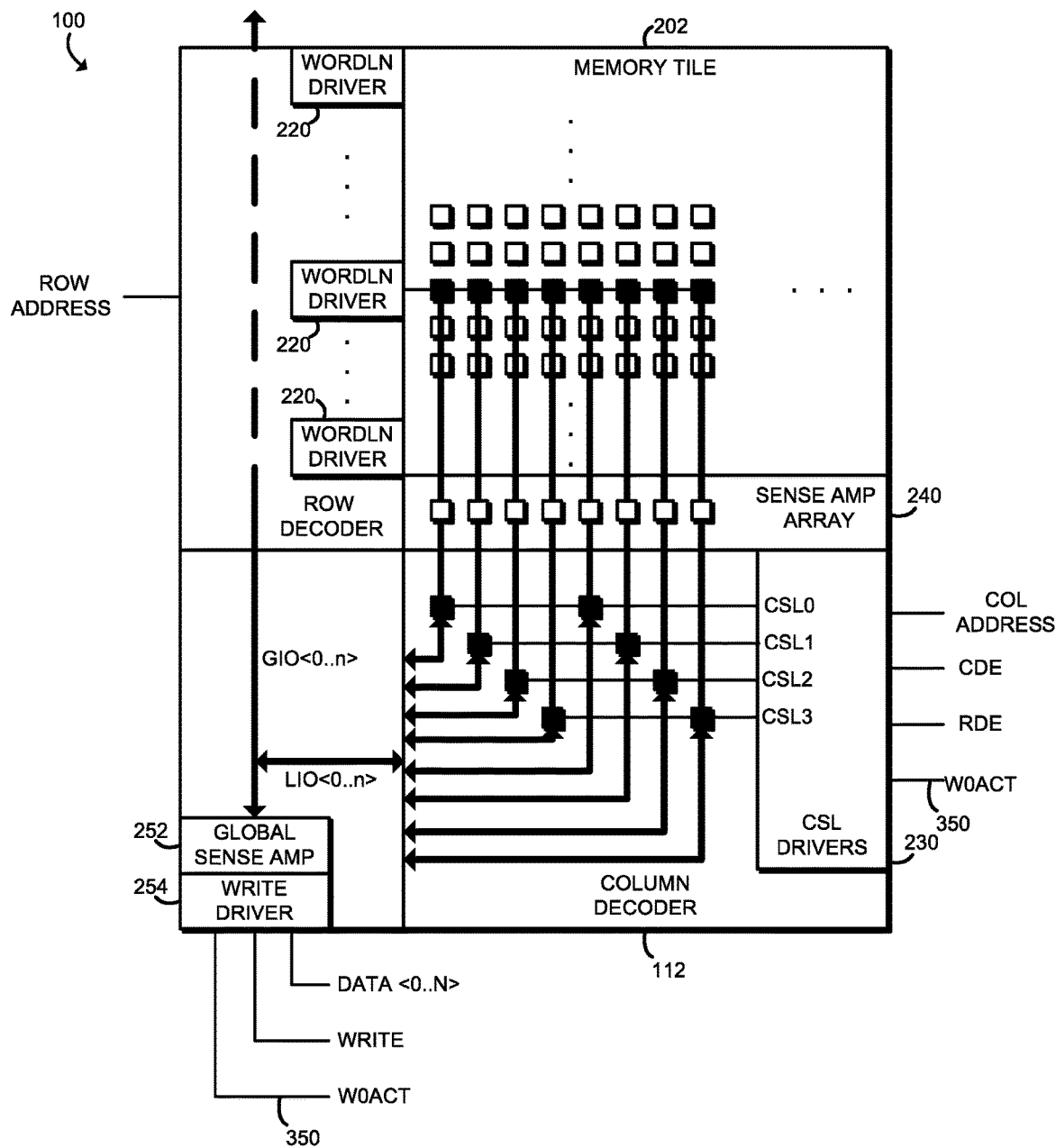
FIG. 4 is a simplified block diagram of the memory tile and associated control circuitry of memory device of FIG. 2 during a page-clear operation.

Referring now to FIG. 4, as discussed above, the illustrative memory device 100 can be configured to clear a page of memory based on a single instruction and/or activation signal. To do so, each column select line driver 230 and each write driver 254 includes an activation input coupled to an activation line 350, which when activated via a corresponding activation signal (W0ACT or WRITE-0) causes the memory device 100 to clear (e.g., write a logical zero) to each memory cell of an addressed row (or one or more columns of an addressed row in some embodiments). To do so, each column select line driver 230 is configured to assert or activate, regardless of the column address, the associated column select line in response to receiving an activation signal (W0ACT) on a corresponding activation input coupled to an activation line 350 local to the corresponding column select line driver 230. That is, the activation signal (W0ACT), which may be active low or active high depending on the implementation, overrides the column address such that each column select line driver 230 asserts its associated column select line. In this way, every column of a row may be selected based on a single activation signal. Alternatively, as discussed in more detail below, a subset of the column select lines (e.g., two or more, but less than all) may be asserted in response the signal activation signal. Illustratively, the activation signal (W0ACT or WRITE-0) is originated by a memory controller associated with the memory device 100 and received by the address command decoder 204. For example, the memory controller may issue the activation signal in response to a request or instruction received from a central processing unit of an associated computing device (e.g., from the processor 1810 of the computing device 1800 described below in regard to FIG. 18).

In the illustrative embodiment, each write driver 254 also includes an activation input coupled to the activation line 350. Each write driver 254 is configured to write a logical zero to the associated global input/output lines (GIO<0 . . . n>), regardless of the data input (DATA<0 . . . n>) (e.g., even if no data is present on the data input (DATA,0 . . . n>) in response to receiving the activation signal (W0ACT or WRITE-0) on the activation line 350 local to the corresponding write driver 254. That is, activation signal (W0ACT or WRITE-0) overrides any data received by the write driver 254 and causes the write driver to write the logical zero to the global input/output lines (GIO<0 . . . n>), which is subsequently written to each memory cell of an addressed row due to the activation of every column select line by the column select line drivers 230 as discussed above. In this way, a single activation or instruction (i.e., activation of the activation line, W0ACT) can cause the memory device 100 to clear a full page of memory of the memory tile 202. In some cases, even if no data is provided on data input (DATA<0 . . . n>), a logical zero can be written to associated with global input/output lines (GIO<0 . . . n>). Instead of a logical zero, any other value can be written.

Figure 5:
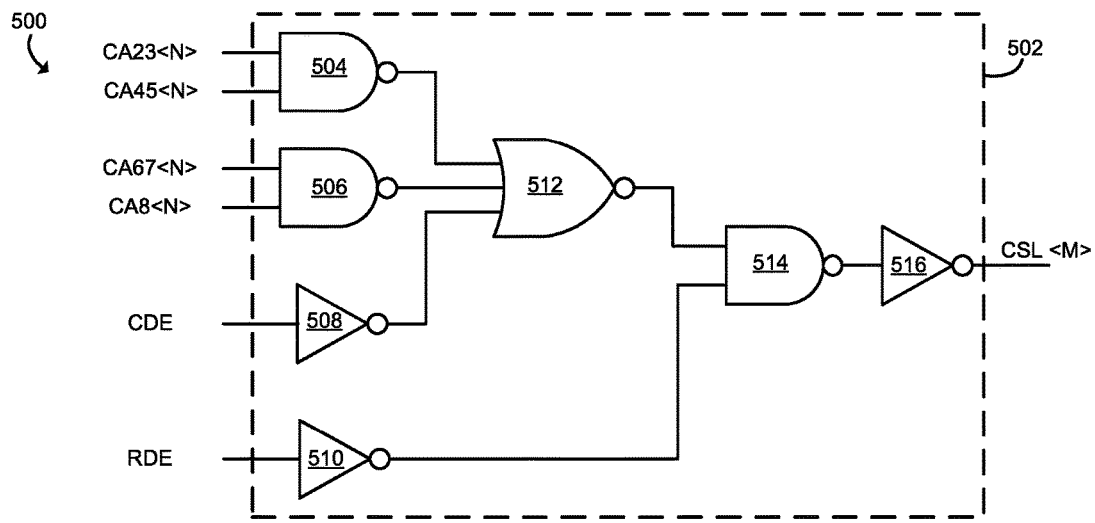
FIG. 5 is a logic circuit diagram of a column select line driver of a typical memory device.

Referring now to FIG. 5, one embodiment of a typical column select line driver 500 is shown. The column select line driver 500 includes a logic circuit 502 formed from a number of logic gates. For example, in the illustrative embodiment, logic circuit 502 includes NAND gates 504, 506, which receive a predecoded column address on predecoded address lines CA23<n>, CA45<n>, CA67<n>, and CA<8>, providing a total of 128 possible addresses. The logic circuit 502 also includes a NOT gate 510, which receives a column decode enable (CDE) signal, and a NOT gate 504, which receives a redundant enable signal (RDE). The illustrative logic circuit 502 also includes a NOR gate 512, which receives the output the NAND gates 504, 506 and the output of the NOT gate 508. Additionally, the logic circuit 502 includes a NAND gate 514, which receives the output of the NOR gate 512 and the output of the NOT gate 510. The output of the NAND gate 514 is coupled to an input of a NOT gate 516, and the output of the NOT gate 516 is coupled to the column select line (CSL<m>) associated with the particular column select line driver 500. Due to the configuration of the logic circuit 502, if a logical input embodied as the predecoded column address, the CDE signal, and the RDE signal is equal to, or otherwise matches, a reference logical input, the logic circuit 502 asserts or activates the corresponding column select line. Of course, it should be appreciated that the typical column select line driver 500 may have a logic circuit 502 having different logic gates and/or logical configuration than column select line driver 500 shown in FIG. 5.

Figure 6:
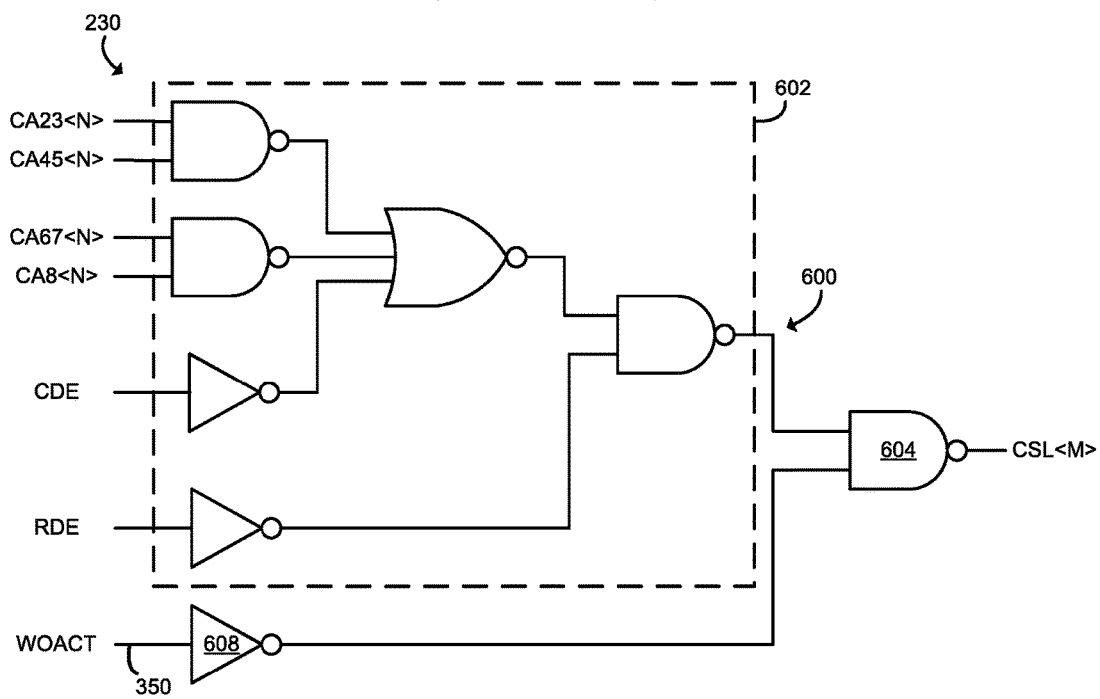
FIG. 6 is a logic circuit diagram of at least one embodiment of a column select line driver of the memory device of FIGS. 1-4.

As discussed above, unlike a typical column select line driver 500, each column select line driver 230 of the memory device 100 is configured or modified to include the activation line, W0ACT. For example, shown in FIG. 6, each column select line driver 230 includes a logic circuit 602, which may be substantially similar to a logic circuit of a typical column select line driver 500. As such, the logic circuit 602 includes a number of logic gates and/or components to receive a logical input including the column address (e.g., a logical input including the predecoded column address, the CDE signal, and the RDE signal) and asserts or activates an output 600 if the logical input matches or is equal to a reference logical input, similar to a typical column select line driver. Of course, the logical configuration of the logic circuit 602 shown in FIG. 6 is merely illustrative, and it should be appreciated that the logic circuit 602 may include different logic gates and/or have a different logical configuration/architecture configured to operate in the manner discussed above in other embodiments.

In addition to the logic circuit 602, however, each column select line drivers 230 also includes a local activation line 350 to receive the activation signal (W0ACT). As discussed above, each column select line driver 230 is configured such that activation of the local activation line 350 causes the column select line driver 230 to assert or activate the associated column select line regardless of the logic input and output of the logic circuit 602. To do so, in the illustrative embodiment, each column select line driver 230 also includes a NAND gate 604, which receives the output 600 from the logic circuit 602 and an output of a NOT gate 608 that receives the activation signal (W0ACT) as an input. The NAND gate 604 generates an output that is supplied to the corresponding column select line. It should be appreciated that, due to the logical configuration of the column select line driver 230, the assertion of the activation signal (W0ACT) causes the column select line driver 230 to assert the associated column select line regardless of the logic input to the logic circuit 602. In this way, a single activation instruction or signal may cause every column select line driver 230 to assert its associated column select line to thereby select every column of an addressed row of the memory tile 202.

Figure 7:
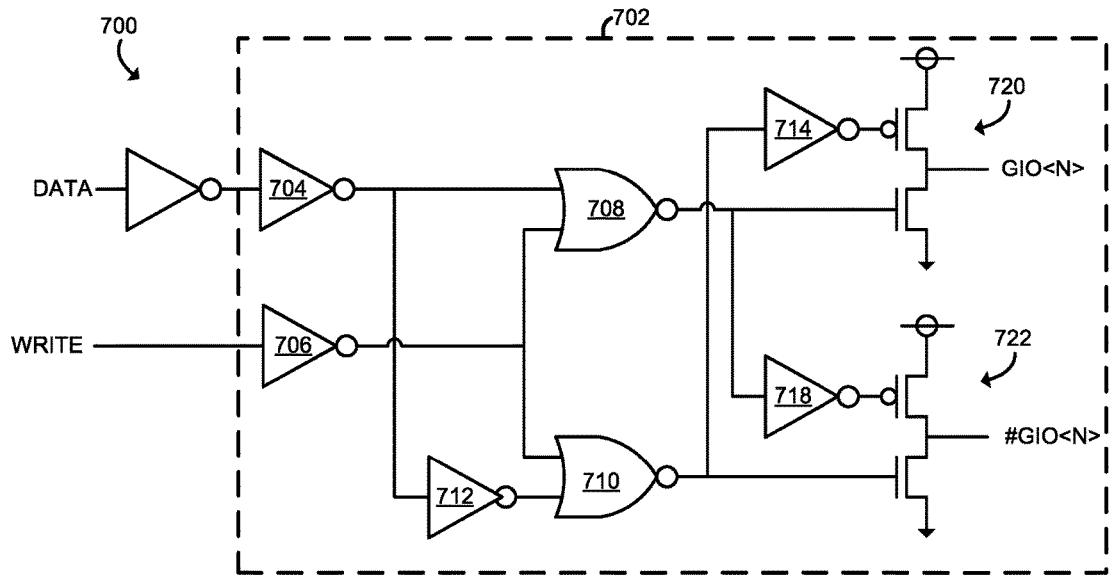
FIG. 7 is a logic circuit diagram of a write driver of a typical memory device.

Referring now to FIG. 7, one embodiment of a typical write driver 700 is shown. The write driver 700 includes a logic circuit 702 formed from a number of logic gates. For example, in the illustrative embodiment, logic circuit 702 includes a NOT gate 704 that receives a data input to the logic circuit 702 (i.e., illustrative, an inverted version of the data signal), and a NOT gate 706 that receives a write enable (WRITE) signal. The illustrative logic circuit 702 also includes a NOR gate 708 that receives the outputs of the NOT gates 704, 706 as input and a NOR gate 710 that receives the output of the NOT gate 706 and an output of a NOT gate 712 that receives the output of the NOT gate 704 as an input. The logic circuit 702 also includes a pair of inverter circuits 720, 722 arranged in a push-pull amplifier configuration that drive associated global input/output lines (GIO<0 . . . n>) to a logic high or a logic low based on a pair of inputs defined by the outputs of the NOR gates 708, 710 and associated NOT gates 714, 718. As such, due to the configuration of the logic circuit 702, the data received on the data input of the logic circuit 702 is driven to the associated global input/output lines (GIO<0 . . . n>) when the write enable (WRITE) signal is asserted.

Figure 8:
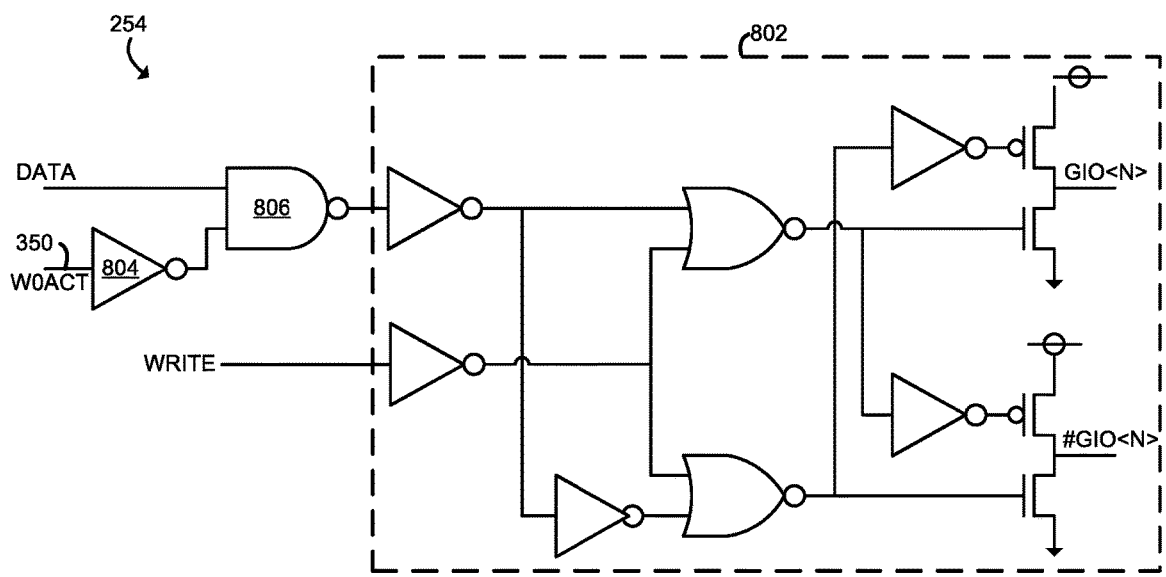
FIG. 8 is a logic circuit diagram of at least one embodiment of a write driver of the memory device of FIGS. 1-4.

As discussed above, unlike a typical write driver 700, each write driver 254 of the memory device 100 is configured or modified to includes a local activation line 350 to receive the activation signal (W0ACT or WRITE-0). For example, shown in FIG. 8, each write driver 254 includes a logic circuit 802, which may be substantially similar to a logic circuit of a typical write driver 700. As such, the logic circuit 802 includes a number of logic gates and/or components to receive a data input and drive the data input to the associated global input/output lines (GIO<0 . . . n>). Of course, the logical configuration of the logic circuit 802 shown in FIG. 8 is merely illustrative, and it should be appreciated that the logic circuit 802 may include different logic gates and/or have a different logical configuration/architecture configured to operate in the manner discussed above in other embodiments.

In addition to the logic circuit 802, however, each write driver 254 is also coupled to a local activation line 350. As discussed above, each write driver 254 is configured such that activation of the local activation line 350 causes the write driver 254 to write a logical zero to the associated global input/output lines (GIO<0 . . . n>) regardless of the data received at the data input of the logic circuit 802 or even if no data is input. To do so, in the illustrative embodiment, each write driver 254 also includes a NAND gate 806 having an output coupled to the data input of the logic circuit 802. The NAND gate 806 receives the data signal, DATA, as an input and an output of a NOT gate 804, which receives the activation signal (W0ACT or WRITE-0) as an input. As such, it should be appreciated that, due to the logical configuration of the write driver 254, the assertion of the activation signal (W0ACT or WRITE-0) causes the write driver 254 to drive a logical zero to the associated global input/output lines (GIO<0 . . . n>). In this way, a signal activation instruction or signal may cause each write driver 254 to write a logical zero to each global input/output line (GIO<0 . . . n>) and, subsequently, to each memory cell of the addressed row due to the cooperative operation of the column select line drivers 230 as discussed above.

Referring now to FIG. 9, in some embodiments, the activation line may be included in a latch circuit array 900, rather than the write drivers 254. In such embodiments, the memory device 100 includes a latch circuit array 900 configured to hold input/output data for multiple memory banks 102 of the memory device 100. For example, the latch circuit array 900 may latch or hold data retrieved from the memory banks 102 and provide the output data to an input/output buffer array 902. Similarly, the latch circuit array 900 may latch or hold input data received from the input/output buffer array 902 for writing into the memory banks 102. In the illustrative embodiment of FIG. 9, the latch circuit array 900 includes the activation line, W0ACT, and is configured to generate a logical zero output to the write drivers 254 of the memory banks 102 in response to assertion or activation of the activation line, W0ACT, regardless of the data input or if even if no data input. As discussed above, in such embodiments, the write drivers 254 may not include the activation line.

Figure 10:
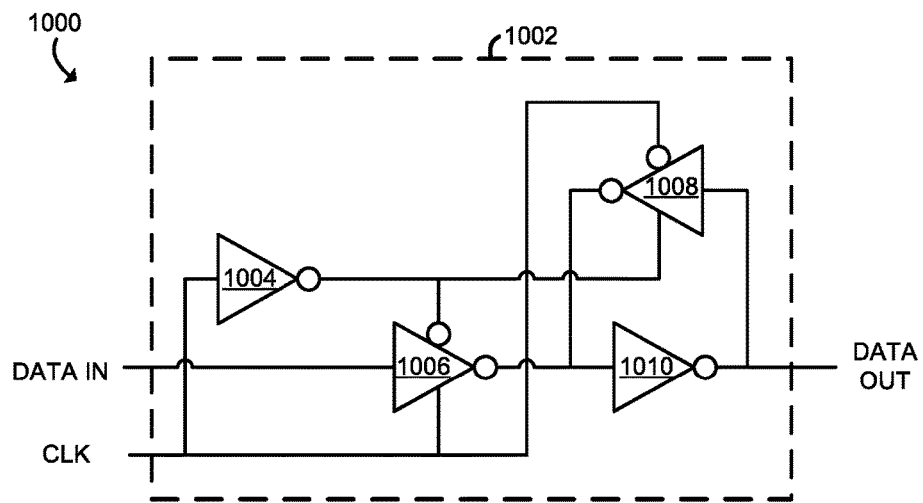
FIG. 10 is a logic circuit diagram of a latch circuit of a typical memory device.

Referring now to FIG. 10, one embodiment of a typical latch circuit 1000 is shown. The latch circuit 1000 includes a logic circuit 1002 formed from a number of logic gates. For example, in the illustrative embodiment, the logic circuit 1002 includes a NOT gate 1004 receiving a clock signal, CLK, as an input. The logic circuit 1002 also includes a pair of clocked NOT gates or inverters 1006, 1008. The clocked inverter 1006 receives the data signal, DATA IN, as an input and the CLK and #CLK signals as clock signal inputs. Additionally, the clocked inverter 1008 receives an output of an inverter 1010 as an input and the CLK and #CLK signals as clock signal inputs. The inverter 1010 receives the output of the clocked inverters 1006, 1008 as an input and generates a data output, DATA OUT. As such, due to the configuration of the latch circuit 1000, the data input is latched every clock cycle to the data output line. For example, during operation, the clocked inverter 1006 operates based on newly received data, and the clocked inverter 1008 latches the data when the clocked inverter 1006 is not driving the data.

Figure 11:
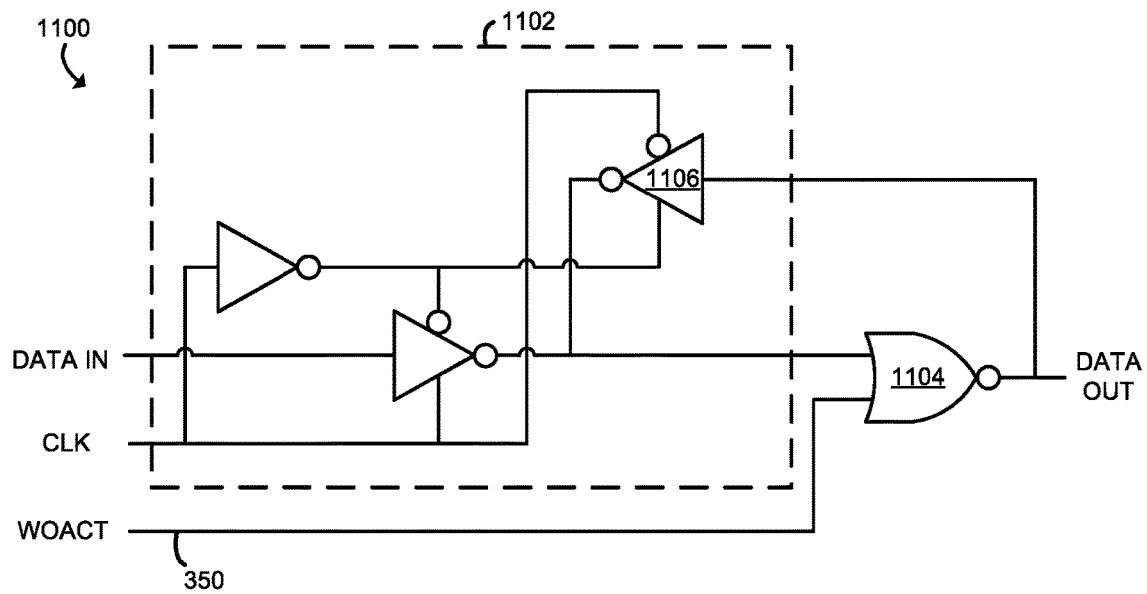
FIG. 11 is a logic circuit diagram of at least one embodiment of a latch circuit of the memory device of FIG. 9.

As discussed above, unlike a typical latch circuit 1000, each latch circuit 1100 of the latch circuit array 900 of the memory device 100 is configured or modified to include an activation line 350 to receive the activation signal (W0ACT or WRITE-0). For example, shown in FIG. 11, each latch circuit 1100 includes a logic circuit 1102, which may be substantially similar to a logic circuit of a typical latch circuit 1000. As such, the logic circuit 1102 includes a number of logic gates and/or components to latch input data to an output of the logic circuit 1102. Of course, the logical configuration of the logic circuit 1102 shown in FIG. 11 is merely illustrative, and it should be appreciated that the logic circuit 1102 may include different logic gates and/or have a different logical configuration/architecture configured to operate in the manner discussed above in other embodiments.

In addition to the logic circuit 1102, however, each latch circuit 1100 also includes a local activation line 350. As discussed above, in the illustrative embodiment, each latch circuit 1100 of the latch circuit array 900 is configured such that activation of the local activation line 350 causes the latch circuit 1100 to generate a logic zero at an output of the latch circuit 1100, which is provided as an input to the associated write drivers 254. To do so, in the illustrative embodiment, each latch circuit 1100 also includes a NOR gate 1104 having a first input to receive the output of the logic circuit 1102 and a second input to receive the activation signal (W0ACT or WRITE-0). The output of the NOR gate 1104 is coupled to an input of a clocked inverter 1106 of the latch circuit 1100 and the data output of the latch circuit 1100. As such, it should be appreciated that, due to the logical configuration of the latch circuit 1100, the assertion of the activation signal (W0ACT or WRITE-0) causes the latch circuit 1100 to generate a logical zero output regardless of the data input to the logic circuit 1102.

Figure 12:
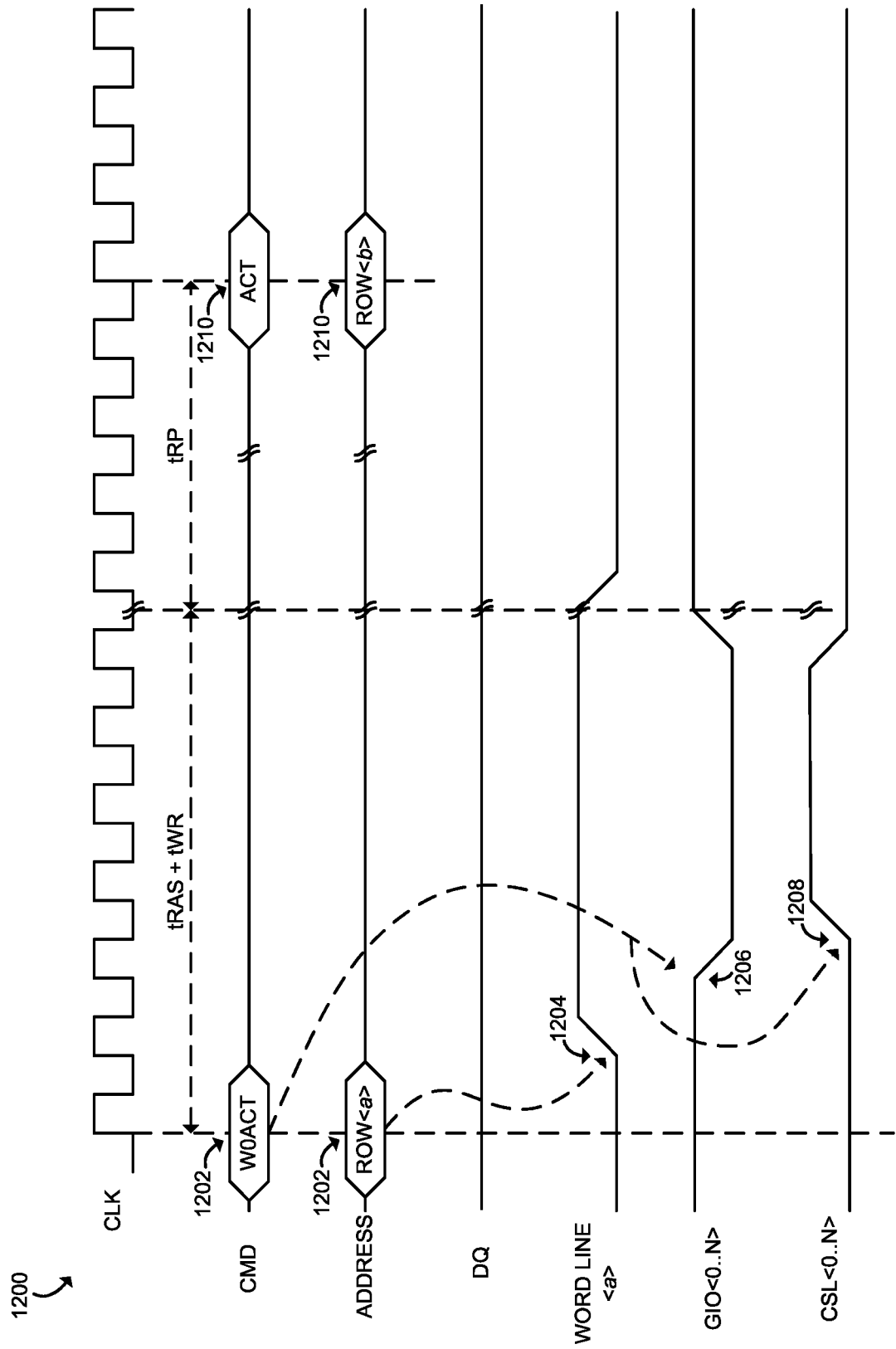
FIG. 12 is a timing diagram of a page clearing operation of an embodiment of the memory device of FIGS. 1-4.

Referring now to FIG. 12, a timing diagram 1200 of the operation of the illustrative embodiment of the memory device 100 during a page clearing operation is shown. As shown, the page clear activation command (W0ACT), is issued at time 1202, along with the row address of the desired page to be cleared. The row address at time 1202 causes the corresponding word line to be asserted at time 1204. Additionally, the page clear command (W0ACT) issued at time 1202 causes the write drivers 254 to drive each global input/output lines (GIO<0 . . . n>) to a logical zero at time 1206. The page clear command (W0ACT) also causes each column select lines (CSL<0 . . . n>) to be asserted at time 1208, after assertion of the word line at time 1204. As such, every column of the selected row is asserted and a logical zero, as indicated by the global input/output lines (GIO<0 . . . n>), is written to each column of the selected row regardless of the actual data (DQ) (or even is no data is present). In this way, every column of the addressed row may be cleared in response to a signal activation signal (W0ACT). As shown in FIG. 12, the writing of the logical zero to each column of the selected row takes an amount depending on the timing parameters of the memory device 100. In the illustrative embodiment, the page clearing operation takes a time noted by the sum of the Row Active time (tRAS) and the Write Recovery time (tWR). The tRAS timing parameter defines the minimum number of clock cycles that a row must be active to ensure enough time to access the memory contents of that row. The tWR timing parameter defines the minimum number of clock cycles required after a write operation to ensure the written contents are properly stored in the corresponding memory cells. After the completion of the page clearing operation, a standard activation signal (ACT) may be issued at time 1210 to address a row and column as normal. The delay time required after the completion of the page clearing operation prior to issuing the tandard activation signal (ACT) is defined by the Row Precharge time (tRP). The tRP timing parameter defines the minimum number of cycles required to select a different row.

Figure 13:
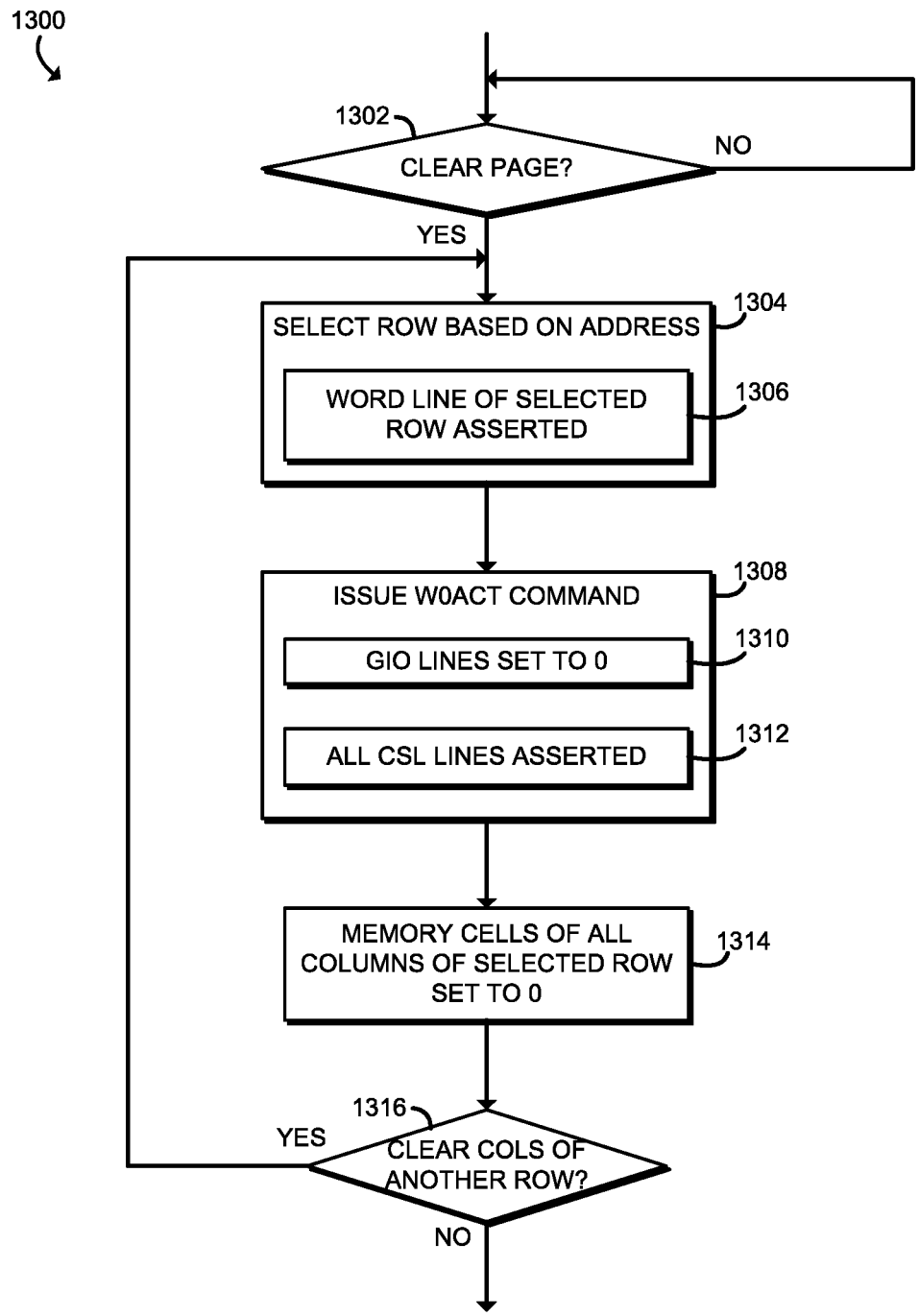
FIG. 13 is a simplified flow diagram of at least one embodiment of a method for clearing a page of memory as illustrated in the timing diagram of FIG. 12.

Referring now to FIG. 13, in operation, the memory device 100 may execute a method 1300 to clear a page of memory of the memory device 100 as outlined in the timing diagram 1200 of FIG. 12. Portions of the method 1300 may be executed by, for example, the control logic 122 of the memory device 100. The method 1300 begins with block 1302 in which the memory device 100 determines whether to clear a page of memory. As discussed above, the memory device 100 may be configured to clear a full page of memory (i.e., every column of an addressed row) in some embodiments. The determination of whether to clear a full page of memory may be based the clearing command itself (i.e., receipt of the W0ACT instruction) and/or hardware configuration. Regardless, if the memory device 100 determines that a page clear operation is desired, the method 1300 advances to block 1304. In block 1304, the row of memory to be cleared is selected based on the row address. To do so, in block 1306, the word line driver 220 associated with the addressed row asserts the associated word line to select the addressed row. Additionally, in block 1308 the page clear activation instruction (W0ACT) is issued, which causes the write drivers 254 (or latch circuits 1100) to drive or set the associated global input/output lines (GIO<0 . . . n>) to a logic zero in block 1310. Additionally, in block 1312, the issuance of the page clear activation instruction (W0ACT) causes each column select line driver 230 to assert each associated column select line.

As a result of the assertion of the word line corresponding to the selected row and the global input/output lines (GIO<0 . . . n>) and column select lines, each memory cell of every column of the addressed row is set to a logical zero in block 1314 as discussed above. Subsequently, in block 1316, the memory device 100 determines whether to clear another page of memory. If so, the method 1300 loops back to block 1304 in which another row of memory to be cleared is selected based on the row address. If not, the method 1300 may end or perform additional functions.

Figure 14:
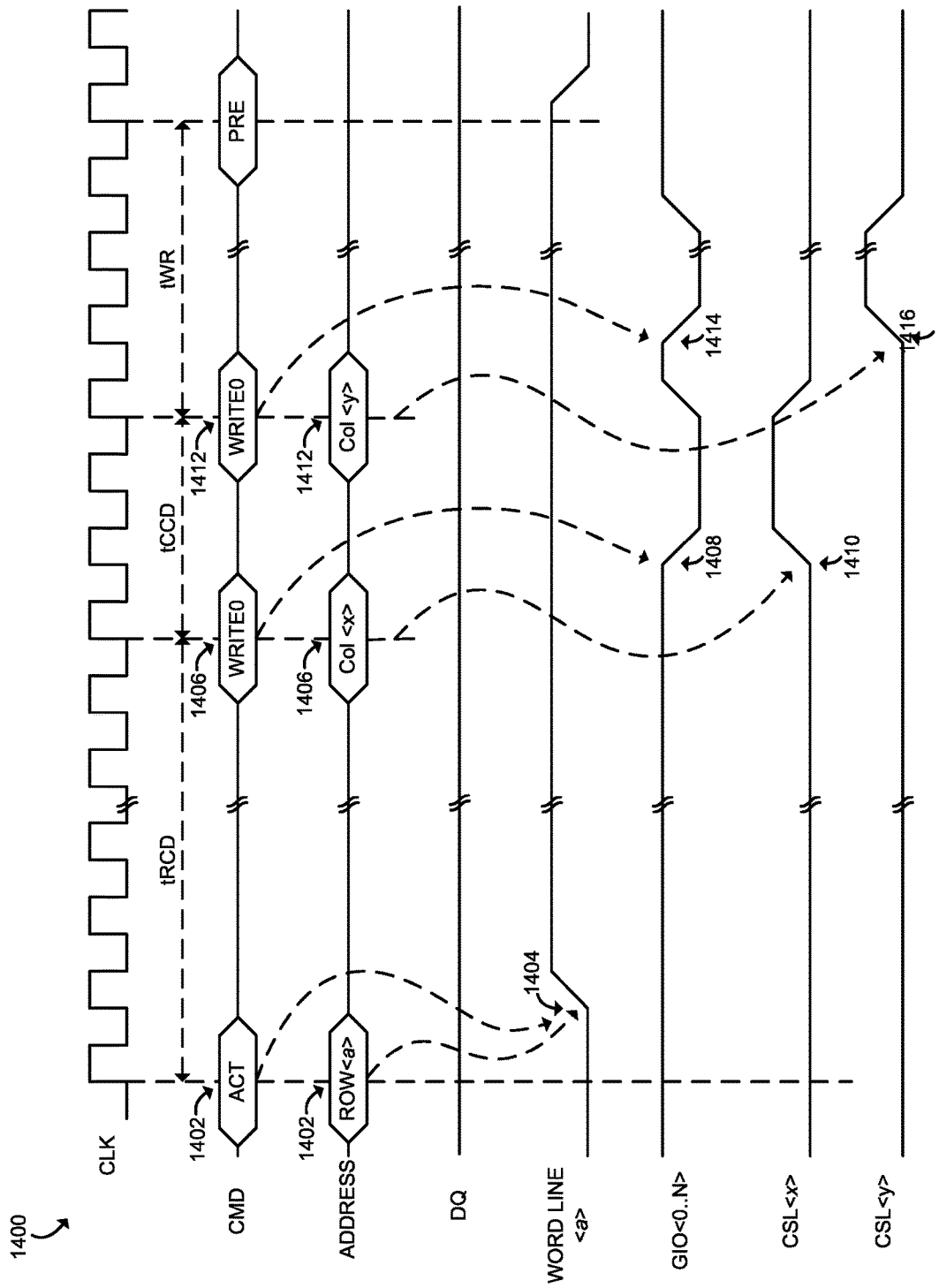
FIG. 14 is a timing diagram of a column clearing operation of another embodiment of the memory device of FIGS. 1-4.

Referring now to FIG. 14, in some embodiments, the memory device 100 may be configured to clear selected columns of an addressed row, rather than every column. In such embodiments, a column clear activation command (WRITE-0) may be issued on the activation line 350 of the write drivers 254 to cause the write drivers 254 to write a logical zero to the global input/output lines (GIO<0 . . . n>) regardless of the present data or even if no data is input. It should be appreciated that the column clear activation command (WRITE-0) may differ from the page clear activation command (W0ACT) in that the column clear activation command (WRITE-0) does not cause the column select line drivers 230 to select every column of the addressed row (i.e., the WRITE-0 command is not received on the activation line 350 local to the column select line drivers). Rather the column select line drivers 230 are configured to select the column of the addressed row based on the column address.

An illustrative timing diagram 1400 of such a column clearing operation is shown in FIG. 14. As shown, the activation command (ACT) is issued at time 1402, along with the row address of the desired memory to be cleared. The activation command and addressed row cause the word line corresponding to the addressed row to be asserted at time 1404. Subsequently, at time 1406, the column clear activation command (WRITE-0) is issued and the desired column of the selected row to be cleared is addressed. The minimum time required between the issuance of the activation command (ACT) at time 1402 and the column clear activation command (WRITE-0) is defined by the Row Address to Column Address Delay time (tRCD) of the memory device 100. The tRCD timing parameter defines the minimum number of cycles that must be pass after selecting a row and prior to selecting a column via the column clear activation command (WRITE-0). The issuance of the column clear activation command (WRITE-0) at time 1406 causes the write drivers 254 to drive global input/output lines (GIO<0 . . . n>) to a logical zero at time 1408. Additionally, the addressed column (Col <x>) at time 1406 causes the corresponding column select line (CSL<x>) to be asserted at time 1410. As such, a logical zero, as indicated by the global input/output lines (GIO<0 . . . n>), is written to the selected row and column (Col <x>) regardless of the actual data (DQ) (or even if the no data is present).

Additional columns of the selected row may also be cleared after an amount of time defined by the Column to Column Delay time (tCCD) of the memory device 100. The tCCD timing parameter defines the minimum number of cycles that must pass between selections of different columns of memory. In the illustrative embodiment of FIG. 14, the column clear activation command (WRITE-0) may be issued again at time 1412 (after tCCD) and the next column of the selected row to be cleared may be addressed. The issuance of the column clear activation command (WRITE-0) causes the write drivers 254 to drive global input/output lines (GIO<0 . . . n>) to a logical zero at time 1414. Additionally, the addressed column (Col <y>) at time 1416 causes the corresponding column select line (CSL<y>) to be asserted at time 1416. As such, a logical zero, as indicated by the global input/output lines (GIO<0 . . . n>), is written to the selected row and column (Col <y>) regardless of the actual data (DQ), if any. After the last column write has been execute, the word line and column lines may be deactivated by a precharge command (PRE), which may be issued after the last column write by an amount of time defined by the Write Recovery time (tWR) of the memory. As discussed above, the tWR timing parameter defines the minimum number of clock cycles required after a write operation to ensure the written contents are properly stored in the corresponding memory cells.

Figure 15:
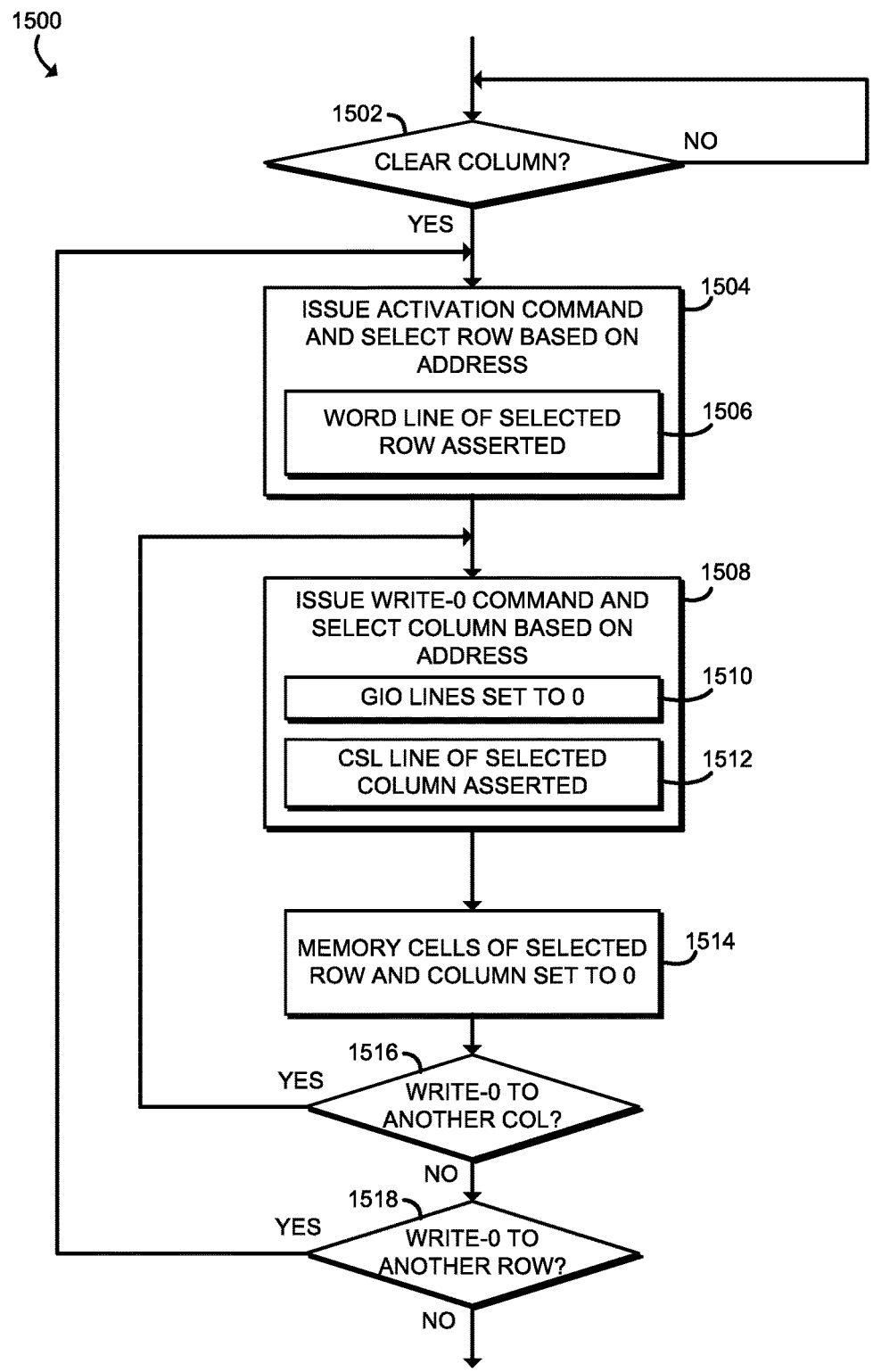
FIG. 15 is a simplified flow diagram of at least one embodiment of a method for clearing a column of memory as illustrated in the timing diagram of FIG. 14.

Referring now to FIG. 15, in operation, the memory device 100 may execute a method 1500 to clear a column of memory of the memory device 100 as outlined in the timing diagram 1400 of FIG. 14. Portions of the method 1500 may be executed by, for example, the control logic 122 of the memory device 100. The method 1500 begins with block 1502 in which the memory device 100 determines whether to clear a column of memory. As discussed above, the determination of whether to clear a column of memory may be based the clearing command itself (i.e., receipt of the WRITE-0 instruction) and/or hardware configuration. Regardless, if the memory device 100 determines that a column clear operation is desired, the method 1500 advances to block 1504. In block 1504, the activation instruction (ACT) is issued and the row to be cleared is addressed. To do so, in block 1506, the word line driver 220 associated with the addressed row asserts the associated word line to select the addressed row. Subsequently, in block 1508, the column clear activation command (WRITE-0) is issued and the desired column of the selected row to be cleared is addressed. The column clear activation command (WRITE-0) causes the write drivers 254 (or latch circuits 1100) to drive or set the associated global input/output lines (GIO<0 . . . n>) to a logic zero in block 1510. Additionally, in block 1512, the addressed row causes the column select lines of the addressed column to be asserted. As a result, in block 1514, the memory cells of the addressed row and column are set to a logical zero.

Subsequently, in block 1516, the memory device 100 determines whether to clear another column of the presently selected row. If so, the method 1500 loops back to block 1508 in which the column clear activation command (WRITE-0) is issued again and the new column to be cleared is selected. If not, the method 1500 advances to block 1518 in which the memory device 100 determines whether to clear one or more columns of another row. If so, the method 1500 loops back to block 1504 in which another row of memory to be cleared is selected based on the row address. If not, the method 1500 may end or perform additional functions.

Figure 16:
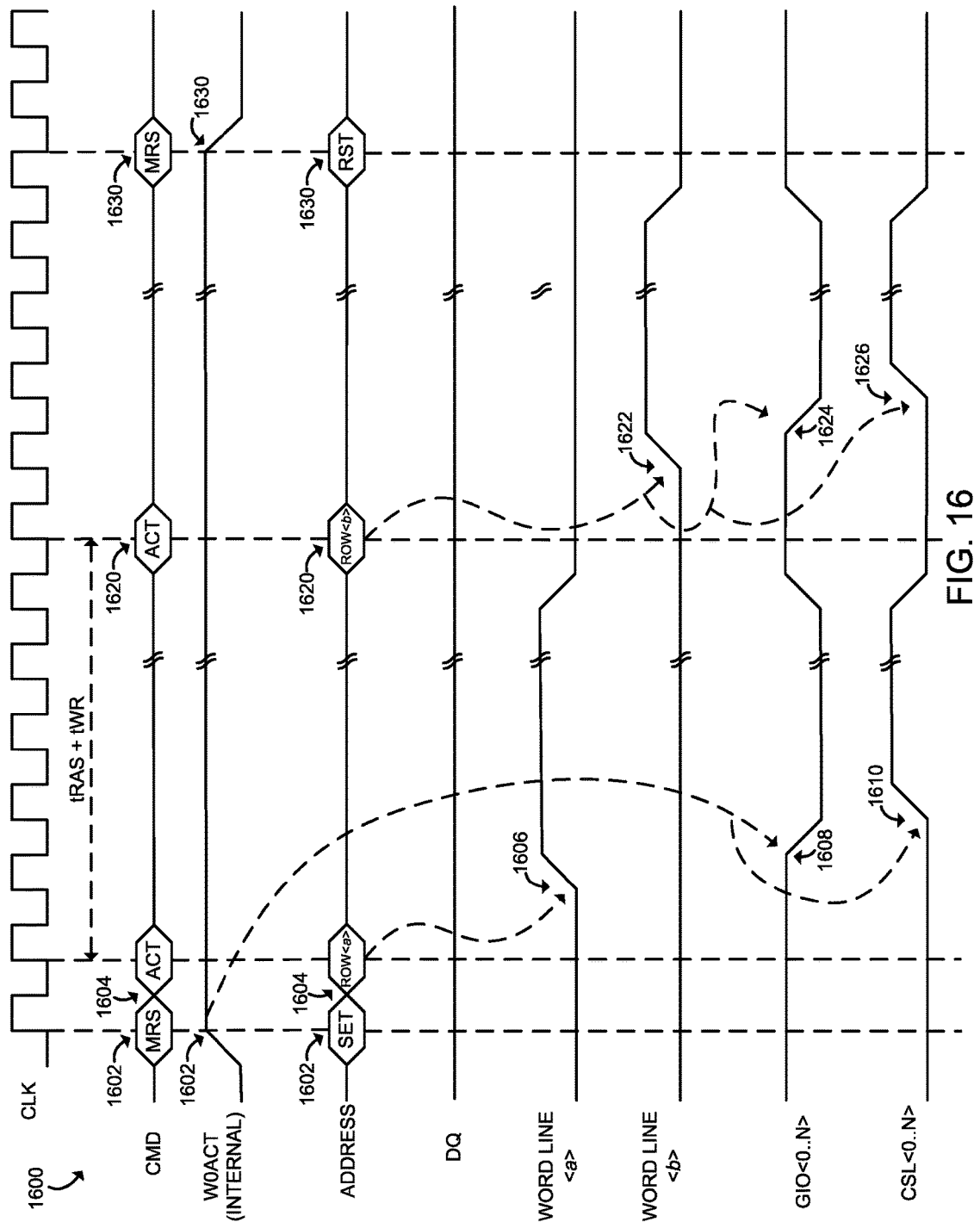
FIG. 16 is a timing diagram of a page clearing operation of another embodiment of the memory device of FIGS. 1-4.

Referring now to FIG. 16, in some embodiments such as those in which the memory device 100 is embodied as a dynamic random-access memory (DRAM), a mode register of the memory device 100 may be used to issue the page clear activation command (W0ACT) to clear a page of memory of the memory device 100. The mode register is a programmable register of DRAM memory devices that includes some bits available for programming to perform specific functions, such as issuance of the internal page clear activation command (W0ACT). In such embodiments, the address command decoder need not decode the additional page clear activation command (W0ACT).

An illustrative timing diagram 1600 of such a page clearing operation is shown in FIG. 16. As shown, the mode register set (MRS) command is issued at time 1602. The issuance of the mode register set command causes the internal activation line 350 (W0ACT) of the column select line drivers 230 and the write drivers 254 to be asserted at time 1602. At time 1604, the activation command (ACT) is issued, along with the row address (ROW <a>) of the desired memory to be cleared. The activation command and addressed row causes the word line corresponding to the addressed row (WORD LINE <a>) to be asserted at time 1606. Additionally, assertion of the internal activation lines 350 (W0ACT) causes the write drivers 254 to drive each global input/output lines (GIO<0 . . . n>) to a logical zero at time 1608 and each column select line (CSL<0 . . . n>) to be asserted at time 1610, after assertion of the word line at time 1606. As such, every column of the selected row is asserted and a logical zero, as indicated by the global input/output lines (GIO<0 . . . n>), is written to each column of the selected row regardless of the actual data (DQ) or even if no data is input. In this way, every column of the addressed row may be cleared in response to a set function of the mode register of the memory device 100.

Because the mode register remains set until reset, the internal activation line 350 (W0ACT) remains asserted until the mode register is reset. As such, another page of memory may be cleared by issuing another activation command (ACT) and the row address (ROW <b>) of the desired memory to be cleared at time 1620. The subsequent activation command (ACT) may be issued after an amount of time defined by the sum of the Row Active time (tRAS) and the Write Recovery time (tWR) of the memory device 100. As discussed above, the tRAS timing parameter defines the minimum number of clock cycles that a row must be active to ensure enough time to access the memory contents of that row. The tWR timing parameter defines the minimum number of clock cycles required after a write operation to ensure the written contents are properly stored in the corresponding memory cells.

The activation command and addressed row at time 1620 causes the word line corresponding to the addressed row (WORD LINE <b>) to be asserted at time 1622. Additionally, assertion of the internal activation lines 350 (W0ACT) causes the write drivers 254 to drive each global input/output lines (GIO<0 . . . n>) to a logical zero at time 1624 and each column select line (CSL<0 . . . n>) to be asserted at time 1626, after assertion of the word line at time 1622. As such, every column of the selected row is asserted and a logical zero, as indicated by the global input/output lines (GIO<0 . . . n>), is written to each column of the selected row regardless of the actual data (DQ) or even if no data is input. Of course, additional columns of other rows may be cleared by issuing further activation signals and the row address of the desired row to be cleared prior to resetting of the mode register. In this way, multiple rows of memory may be cleared. After the desired rows of memory have been cleared, the activation line 350 (W0ACT) may be deactivated by issuance of a mode register reset command at time 1630.

Figure 17:
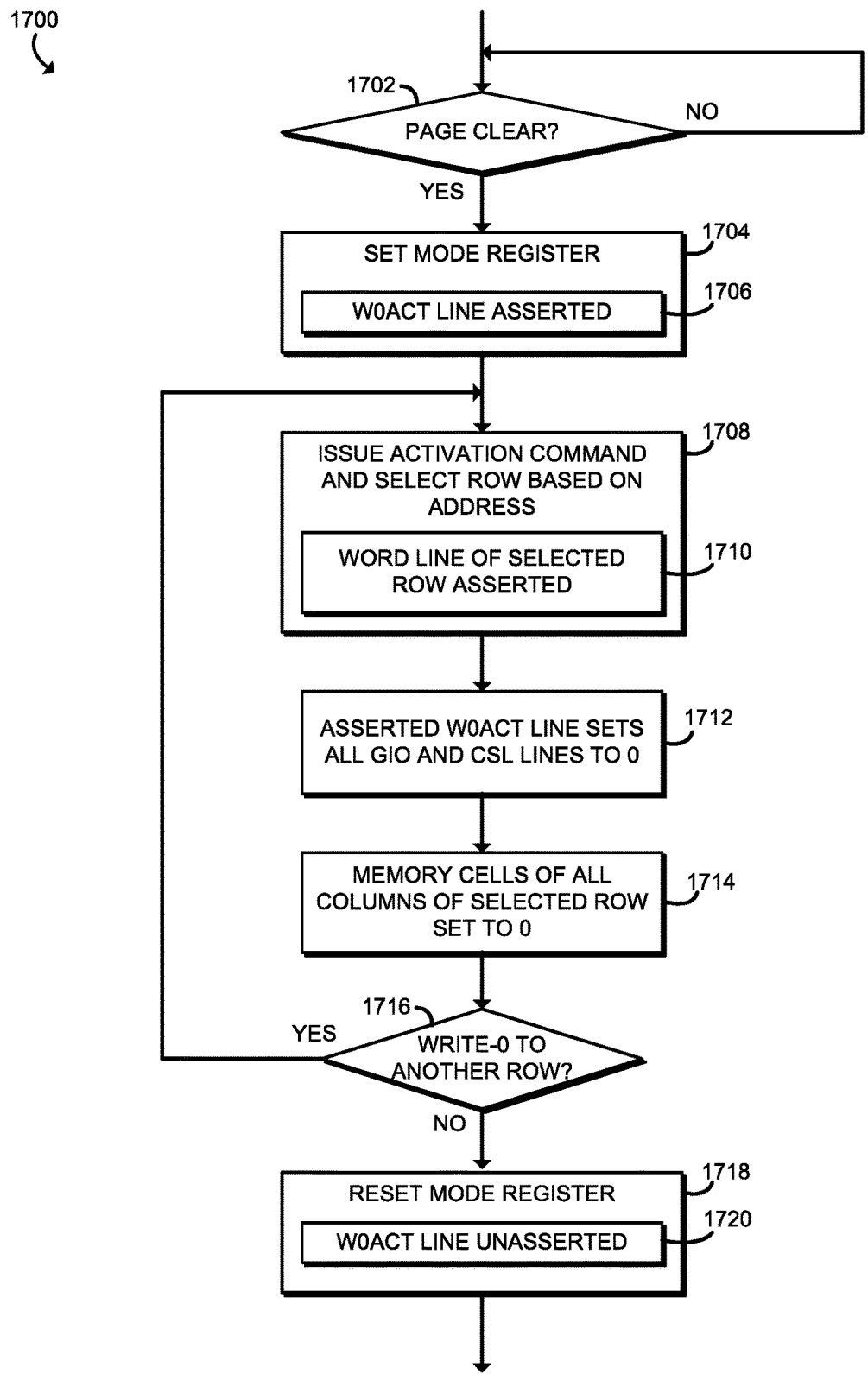
FIG. 17 is a simplified flow diagram of another embodiment of a method for clearing a page of memory as illustrated in the timing diagram of FIG. 16.

Referring now to FIG. 17, in operation, the memory device 100 may execute a method 1700 to clear a page of memory of the memory device 100 as outlined in the timing diagram 1600 of FIG. 16. Portions of the method 1700 may be executed by, for example, the control logic 122 of the memory device 100. The method 1700 begins with block 1702 in which the memory device 100 determines whether to clear a page of memory. As discussed above, the determination of whether to clear a full page of memory may be based the clearing command itself and/or hardware configuration. Regardless, if the memory device 100 determines that a page clear operation is desired, the method 1700 advances to block 1704. In block 1704, the mode register of the memory device 100 is set. The setting of the mode register causes the internal activation lines 350 (W0ACT) to be asserted in block 1706. In block 1708, the activation instruction (ACT) is issued and the row to be cleared is addressed. To do so, in block 1710, the word line driver 220 associated with the addressed row asserts the associated word line to select the addressed row. Additionally, in block 1712, the internal activation lines 350 (W0ACT) asserted in block 1706 causes the write drivers 254 (or latch circuits 1100) to drive or set the associated global input/output lines (GIO<0 . . . n>) to a logic zero and each column select line driver 230 to assert each associated column select line.

As a result of the assertion of the word line corresponding to the selected row and the global input/output lines (GIO<0 . . . n>) and column select lines, each memory cell of every column of the addressed row is set to a logical zero in block 1714 as discussed above. Subsequently, in block 1716, the memory device 100 determines whether to clear another page of memory. If so, the method 1700 loops back to block 1708 in which another row of memory to be cleared is selected based on the row address. If not, the method 1700 advances to block 1718 in which the mode register of the memory device 100 is reset. In response, the internal activation lines 350 (W0ACT) are deactivated or unasserted in block 1720. Thereafter, the method 1700 may end or perform additional functions.

Figure 18:
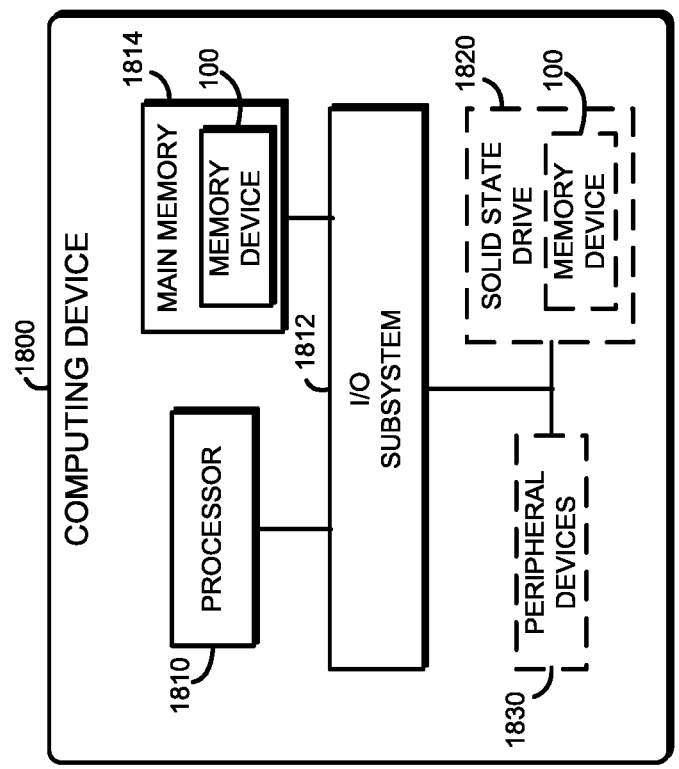
FIG. 18 is a simplified block diagram of at least one embodiment of a computing device including the memory device of FIGS. 1-4.

Referring now to FIG. 18, in some embodiments, the memory device 100 may be incorporated in, or form a portion of, a computing device 1800. The computing device 1800 may be embodied as any type of computing device in which the memory device 100 may be used. For example, the computing device 1800 may be embodied as a smart phone, a tablet computer, a notebook, a laptop computer, a netbook, an Ultrabook™, a wearable computing device, a pair of smart glasses, a head-mounted computing device, a cellular phone, a desktop computer, a smart device, a personal digital assistant, a mobile Internet device, a server, a data storage device, and/or any other computing/communication device. As shown in FIG. 18, the illustrative computing device 1800 includes a processor 1810, an input/output ("I/O") subsystem 1812, and a main memory 1814. Of course, the computing device 1800 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. For example, the memory 1814, or portions thereof, may be incorporated in the processor 1810 in some embodiments.

The processor 1810 may be embodied as any type of processor capable of performing the functions described herein. For example, the processor 1810 may be embodied as a single or multi-core processor(s), digital signal processor, microcontroller, or other processor or processing/controlling circuit. Similarly, the memory 1814 may be embodied as any type of volatile or non-volatile memory or data storage capable of performing the functions described herein. In operation, the memory 1814 may store various data and software used during operation of the computing device 1800 such as operating systems, applications, programs, libraries, and drivers. The memory 1814 is communicatively coupled to the processor 1810 via the I/O subsystem 1812, which may be embodied as circuitry and/or components to facilitate input/output operations with the processor 1810, the memory 1814, and other components of the computing device 1800. For example, the I/O subsystem 1812 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

In the illustrative embodiment, the main memory 1814 includes the memory device 100. As such, the main memory 1814 may be configured to clear a page or selected columns of memory of the memory device 100 using a signal instruction or activation signal (W0ACT or WRITE-0) as discussed in detail above.

In some embodiments, the computing device 1800 may include various additional peripheral devices 1830, such as various input/output devices. For example, in an illustrative embodiment, the computing device 1800 includes a solid state drive 1820, which may be configured to store data in a persistent manner. In such embodiments, the memory device 100 may be included in, or otherwise form a portion of, the solid state drive 1820. As such, the solid state drive may be configured to clear a page or column of memory of the memory device 100 using a signal instruction or activation signal (W0ACT or WRITE-0) as discussed in detail above.

EXAMPLES

Illustrative examples of the technologies disclosed herein are provided below. An embodiment of the technologies may include any one or more, and any combination of, the examples described below.

Example 1 includes a memory device for clearing a page of memory, the memory device comprising a memory tile comprising a plurality of memory cells, the memory cells associated with rows and columns; a row decoder associated with the memory tile, the row decoder to select a row of the memory cells of the memory tile based on a memory address; a column decoder associated with the memory tile, the column decoder to select a column of memory cells of the memory tile based on the memory address, wherein the column decoder comprises an activation input and is further to select every column of the memory cells of the memory tile in response to receipt of an activation signal received on the activation input; and a write driver to set a plurality of global input/output lines to a value to write the value to each of the memory cells of the row selected by the row decoder and the columns selected by the column decoder in response to the activation signal.

Example 2 includes the subject matter of Example 1, and wherein the column decoder comprises a plurality of column select line drivers and each column select line driver is to assert a corresponding column select line to select a plurality of associated columns of the memory cells of the memory tile in response to a logical input of the corresponding column select line driver being equal to a corresponding reference logical input, wherein each column select line driver includes a local activation input and is further to assert the corresponding column select line in response to the activation signal being received on the local activation input regardless of the logical input.

Example 3 includes the subject matter of any of Examples 1 and 2, and wherein each column select line driver includes a logic circuit formed from a plurality of logic gates, each logic circuit comprising a plurality of inputs to receive the logical inputs of the corresponding column select line driver and an output at which a respective logical output is produced based on the corresponding logical input, wherein each column select line driver further comprises a NAND gate having a first input line connected to the output line of the corresponding logic circuit and a second input line connected to an output line of an inverter, wherein the inverter has an input connected to the activation input and the NAND gate further has an output line connected to the corresponding column select line.

Example 4 includes the subject matter of any of Examples 1-3, and wherein the write driver comprises a plurality of write driver circuits and each write driver circuit is to set a value of a corresponding global input/output line based on a data input, wherein each write driver circuit includes a local activation input and is further to set the corresponding global input/output line to a value in response to the activation signal received on the local activation input regardless of a value of the data input.

Example 5 includes the subject matter of any of Examples 1-4, and wherein each write driver includes a logic circuit formed from a plurality of logic gates and having an input line, wherein the write driver further includes a NAND gate having a first input line connected to a data input line to receive the data input and a second input line connected to an output line of an inverter, wherein the inverter includes an input line connected to the local activation input and the NAND gate further includes an output line connected to the input line of the logic circuit.

Example 6 includes the subject matter of any of Examples 1-5, and further including a latch circuit array including a plurality of latch circuits, wherein a latch circuit of the plurality of latch circuits includes a data output line connected to a data input line of the write driver to receive a data output of the latch circuit, wherein the latch circuit includes a local activation input and is configured to set the data output to a value in response to the activation signal received on the local activation input.

Example 7 includes the subject matter of any of Examples 1-6, and wherein the latch circuit includes a logic circuit formed from a plurality of logic gates and having a logic circuit input line to receive a data input and a logic circuit output line, wherein the latch circuit further includes a NOR gate having a first input line connected to the logic circuit output line, a second input line connected to the local activation input, and an output line connected to the data output line at which the data output is produced.

Example 8 includes the subject matter of any of Examples 1-7, and wherein each latch circuit is connected to a different bank of memory tiles and includes a local activation input and a corresponding data output line connected to a write driver of the corresponding bank of memory tiles, wherein each latch circuit is configured to set a data output produced at the corresponding data output line to a value in response to the activation signal received on the corresponding local activation input.

Example 9 includes the subject matter of any of Examples 1-8, and wherein the activation signal is generated based on a setting of a mode register of the memory device.

Example 10 includes the subject matter of any of Examples 1-9, and further including a plurality of local input/output lines, wherein each local input/output line is connected to a corresponding one of the plurality of global input/output lines and to the column decoder.

Example 11 includes the subject matter of any of Examples 1-10, and further including a plurality of sense amplifiers, wherein each sense amplifier is to receive an output of a corresponding memory cell selected by the row decoder and provide an amplified output to the column decoder.

Example 12 includes a memory device for clearing a page of memory, the memory device comprising a memory tile comprising a plurality of memory cells arranged in rows and columns; a row decoder associated with the memory tile, the row decoder to select a row of the memory cells of the memory tile based on a memory address; a column decoder associated with the memory tile, the column decoder to select a column of memory cells of the memory tile based on the memory address; and a write driver to set each of a plurality of global input/output lines to a value to write the value to each of the memory cells of the row selected by the row decoder and the columns selected by the column decoder in response to an activation signal.

Example 13 includes the subject matter of Example 12, and wherein the column decoder is to select a first column of memory cells of the memory tile based on a first memory address and select a second column of memory cells of the memory tile based on a second memory address, and wherein the write driver is to set each of the plurality of global input/output line to the value to write the value to each of the memory cells of (i) the first row in response to receiving the activation signal at a first time when the first column is selected and (ii) the second row in response to receiving the activation signal at a second time when the second column is selected.

Example 14 includes the subject matter of any of Examples 12 and 13, and wherein the write driver comprises a plurality of write driver circuits and each write driver circuit is to set a value of a corresponding global input/output line based on a data input, wherein each write driver circuit includes a local activation input and is further to set the corresponding global input/output line to a value in response to the activation signal received on the local activation input regardless of the value of the data input.

Example 15 includes the subject matter of any of Examples 12-14, and wherein each write driver includes a logic circuit formed from a plurality of logic gates and having an input line, wherein the write driver further includes a NAND gate having a first input line connected to a data input line to receive the data input and a second input line connected to an output line of an inverter, wherein the inverter includes an input line connected to the local activation input and the NAND gate further includes an output line connected to the input line of the logic circuit.

Example 16 includes the subject matter of any of Examples 12-15, and further including a latch circuit array including a plurality of latch circuits, wherein a latch circuit of the plurality of latch circuits includes a data output line connected to a data input line of the write driver to receive a data output of the latch circuit, wherein the latch circuit includes a local activation input and is configured to set the data output to a value in response to the activation signal received on the local activation input.

Example 17 includes the subject matter of any of Examples 12-16, and wherein the latch circuit includes a logic circuit formed from a plurality of logic gates and having a logic circuit input line to receive a data input and a logic circuit output line, wherein the latch circuit further includes a NOR gate having a first input line connected to the logic circuit output line, a second input line connected to the local activation input, and an output line connected to the data output line at which the data output is produced.

Example 18 includes the subject matter of any of Examples 12-17, and wherein each latch circuit is connected to a different bank of memory tiles and includes a local activation input and a corresponding data output line connected to a write driver of the corresponding bank of memory tiles, wherein each latch circuit is configured to set a data output produced at the corresponding data output line to a value in response to the activation signal received on the corresponding local activation input.

Example 19 includes a memory device for clearing a page of memory, the memory device comprising a plurality of memory banks, each memory bank comprising: a plurality of memory tiles, each memory tile comprising a plurality of memory cells arranged in rows and columns; a row decoder associated with each memory tile, the row decoder to select a row of the memory cells based on a memory address; a column decoder associated with each memory tile, the column decoder to select a column of memory cells of each memory tile based on the memory address, wherein the column decoder comprises an activation input and is further to select two or more columns of the memory cells in response to an activation signal received on the activation input; and a write driver to set each of a plurality of global input/output lines to a value to write the value to each of the memory cells of the row selected by the row decoder and the columns selected by the column decoder in response to the activation signal.

Example 20 includes the subject matter of Example 19, and wherein the column decoder comprises a plurality of column select line drivers and each column select line driver is to assert a corresponding column select line to select a plurality of associated columns of the memory cells in response to a logical input of the corresponding column select line driver being equal to a corresponding reference logical input, wherein each column select line driver includes a local activation input and is further to assert the corresponding column select line in response to the activation signal being received on the local activation input regardless of the logical input.

Example 21 includes the subject matter of any of Examples 19 and 20, and wherein the write driver comprises a plurality of write driver circuits and each write driver circuit is to set a value of a corresponding global input/output line based on a data input, wherein each write driver circuit includes a local activation input and is further to set the corresponding global input/output line to a value in response to the activation signal received on the local activation input regardless of the value of the data input.

Example 22 includes the subject matter of any of Examples 19-21, and further including a latch circuit array including a plurality of latch circuits, wherein each latch circuit array includes a data output line connected to a data input line of the write driver of a corresponding memory bank to receive a data output of the corresponding latch circuit, wherein each latch circuit includes a local activation input and is configured to set the data output to a value in response to the activation signal received on the local activation input.

Example 23 includes the subject matter of any of Examples 19-22, and wherein the activation signal is generated based on a setting of a mode register of the memory device.

Example 24 includes a method for clearing a page of memory of a memory device, the method comprising selecting, by a row decoder, a row of memory cells of a memory tile of the memory device based on a memory address; selecting, by a column decoder, every column of memory cells of the selected row of memory cells of the memory tile in response to an activation signal received by the column decoder; and writing, by a write driver, a value to a plurality of global input/output lines to write the value to each of the memory cells of the row selected by the row decoder and the columns selected by the column decoder regardless of a data input received on a data input line of the write driver.

Example 25 includes the subject matter of Example 24, and wherein writing the value to the plurality of global input/output lines comprises writing, by the write driver, the value to the plurality of global input/output lines in response to the activation signal received on a local activation input of the write driver and regardless of a data input received on a data input line of the write driver.

Example 26 includes the subject matter of any of Examples 24 and 25, and wherein writing the value to the plurality of global input/output lines comprises setting, by a latch circuit, a data input of the write driver to a value in response to the activation signal.

Example 27 includes the subject matter of any of Examples 24-26, and further including generating the activation signal by an address command decoder.

Example 28 includes the subject matter of any of Examples 24-27, and further including generating the activation signal by setting a mode register of the memory device.

Example 29 includes a method for clearing a page of memory of a memory device, the method comprising selecting, by a row decoder, a row of memory cells of a memory tile of the memory device based on a memory address; selecting, by a column decoder, a column of memory cells of the selected row of memory cells of the memory tile based on the memory address; writing, by a write driver, a value to a plurality of global input/output lines to write the value to each of the memory cells of the row selected by the row decoder and the columns selected by the column decoder in response to receiving an activation signal and regardless of a data input received on a data input line of the write driver.

Example 30 includes the subject matter of Example 29, and wherein writing the value to the plurality of global input/output lines comprises writing, by the write driver, the value to the plurality of global input/output lines in response to receiving the activation signal on a local activation input of the write driver.

Example 31 includes the subject matter of any of Examples 29 and 30, and wherein writing the value to the plurality of global input/output lines comprises setting, by a latch circuit, a data input of the write driver to a value in response to receiving, by the latch circuit, the activation signal.

Example 32 includes the subject matter of any of Examples 29-31, and further including generating the activation signal by an address command decoder.

Example 33 includes the subject matter of any of Examples 29-32, and further including generating the activation signal by setting a mode register of the memory device.

Example 34 includes one or more machine-readable storage media comprising a plurality of instructions stored thereon that in response to being executed result in a memory device performing the method of any of Examples 24-33.

Example 35 includes a memory device for clearing a page of memory, the memory device comprising means for selecting a row of memory cells of a memory tile of the memory device based on a memory address; means for selecting every column of memory cells of the selected row of memory cells of the memory tile in response to an activation signal; and means for writing a value to a plurality of global input/output lines to write the value to each of the memory cells of the selected row and the selected columns regardless of a data input received by a write driver of the memory device.

Example 36 includes the subject matter of Example 35, and wherein the means for writing the value to the plurality of global input/output lines comprises means for writing the value to the plurality of global input/output lines in response to the activation signal received on a local activation input of the write driver and regardless of a data input received on a data input line of the write driver.

Example 37 includes the subject matter of any of Examples 35 and 36, and wherein the means for writing the value to the plurality of global input/output lines comprises means for setting a data input of the write driver to a value in response to the activation signal.

Example 38 includes the subject matter of any of Examples 35-37, and further comprising means for generating the activation signal.

Example 39 includes a memory device for clearing a page of memory, the memory device comprising means for selecting a row of memory cells of a memory tile of the memory device based on a memory address; means for selecting a column of memory cells of the selected row of memory cells of the memory tile based on the memory address; means for writing a value to a plurality of global input/output lines to write the value to each of the memory cells of the selected row and selected column in response to receiving an activation signal and regardless of a data input received on a data input line of a write driver of the memory device.

Example 40 includes the subject matter of Example 39, and wherein the means for writing the value to the plurality of global input/output lines comprises means for writing the value to the plurality of global input/output lines in response to receiving the activation signal on a local activation input of the write driver.

Example 41 includes the subject matter of any of Examples 39 and 40, and wherein the means for writing the value to the plurality of global input/output lines comprises means for setting a data input of the write driver to a value in response to receiving the activation signal.

Example 42 includes the subject matter of any of Examples 39-41, and further including means for generating the activation signal.

The invention claimed is:

1. A memory device for clearing a page of memory, the memory device comprising:
   a memory tile comprising a plurality of memory cells, the memory cells associated with rows and columns;
   a row decoder associated with the memory tile, the row decoder to select a row of the memory cells of the memory tile based on a memory address;
   a column decoder associated with the memory tile, the column decoder to select a column of memory cells of the memory tile based on the memory address, wherein the column decoder comprises an activation input and is further to select every column of the memory cells of the memory tile in response to receipt of an activation signal received on the activation input; and
   a write driver to set a plurality of global input/output lines to a value to write the value to each of the memory cells of the row selected by the row decoder and the columns selected by the column decoder in response to the activation signal.

2. The memory device of claim 1, wherein the column decoder comprises a plurality of column select line drivers and each column select line driver is to assert a corresponding column select line to select a plurality of associated columns of the memory cells of the memory tile in response to a logical input of the corresponding column select line driver being equal to a corresponding reference logical input, wherein each column select line driver includes a local activation input and is further to assert the corresponding column select line in response to the activation signal being received on the local activation input regardless of the logical input.

3. The memory device of claim 2, wherein each column select line driver includes a logic circuit formed from a plurality of logic gates, each logic circuit comprising a plurality of inputs to receive the logical inputs of the corresponding column select line driver and an output at which a respective logical output is produced based on the corresponding logical input, wherein each column select line driver further comprises a NAND gate having a first input line connected to the output line of the corresponding logic circuit and a second input line connected to an output line of an inverter, wherein the inverter has an input connected to the activation input and the NAND gate further has an output line connected to the corresponding column select line.

4. The memory device of claim 1, wherein the write driver comprises a plurality of write driver circuits and each write driver circuit is to set a value of a corresponding global input/output line based on a data input, wherein each write driver circuit includes a local activation input and is further to set the corresponding global input/output line to a value in response to the activation signal received on the local activation input regardless of a value of the data input.

5. The memory device of claim 4, wherein each write driver includes a logic circuit formed from a plurality of logic gates and having an input line, wherein the write driver further includes a NAND gate having a first input line connected to a data input line to receive the data input and a second input line connected to an output line of an inverter, wherein the inverter includes an input line connected to the local activation input and the NAND gate further includes an output line connected to the input line of the logic circuit.

6. The memory device of claim 1, further comprising a latch circuit array including a plurality of latch circuits, wherein a latch circuit of the plurality of latch circuits includes a data output line connected to a data input line of the write driver to receive a data output of the latch circuit, wherein the latch circuit includes a local activation input and is configured to set the data output to a value in response to the activation signal received on the local activation input.

7. The memory device of claim 6, wherein the latch circuit includes a logic circuit formed from a plurality of logic gates and having a logic circuit input line to receive a data input and a logic circuit output line, wherein the latch circuit further includes a NOR gate having a first input line connected to the logic circuit output line, a second input line connected to the local activation input, and an output line connected to the data output line at which the data output is produced.

8. The memory device of claim 6, wherein each latch circuit is connected to a different bank of memory tiles and includes a local activation input and a corresponding data output line connected to a write driver of the corresponding bank of memory tiles, wherein each latch circuit is configured to set a data output produced at the corresponding data output line to a value in response to the activation signal received on the corresponding local activation input.

9. The memory device of claim 1, wherein the activation signal is generated based on a setting of a mode register of the memory device.

10. One or more non-transitory, machine-readable storage media comprising a plurality of instructions stored thereon that, when executed, cause a memory device to:
    select, by a row decoder, a row of memory cells of a memory tile of the memory device based on a memory address;
    select, by a column decoder, every column of memory cells of the selected row of memory cells of the memory tile in response to an activation signal received by the column decoder; and
    write, by a write driver, a value to a plurality of global input/output lines to write the value to each of the memory cells of the row selected by the row decoder and the columns selected by the column decoder regardless of a data input received on a data input line of the write driver.

11. The one or more non-transitory, machine-readable storage media of claim 10, wherein to write the value to the plurality of global input/output lines comprises to write the value to the plurality of global input/output lines in response to the activation signal received on a local activation input of the write driver and regardless of a data input received on a data input line of the write driver.

12. The one or more non-transitory, machine-readable storage media of claim 10, wherein to write the value to the plurality of global input/output lines comprises to set, by a latch circuit, a data input of the write driver to a value in response to the activation signal.

13. The one or more non-transitory, machine-readable storage media of claim 10, wherein the activation signal is produced by an address command decoder if the memory device.

14. The one or more non-transitory, machine-readable storage media of claim 10, wherein the activation signal is generated in response to a mode register of the memory device being set.

15. A method for clearing a page of memory of a memory device, the method comprising:
   selecting, by a row decoder, a row of memory cells of a memory tile of the memory device based on a memory address;
   selecting, by a column decoder, every column of memory cells of the selected row of memory cells of the memory tile in response to an activation signal received by the column decoder; and
   writing, by a write driver, a value to a plurality of global input/output lines to write the value to each of the memory cells of the row selected by the row decoder and the columns selected by the column decoder regardless of a data input received on a data input line of the write driver.

16. The method of claim 15, wherein writing the value to the plurality of global input/output lines comprises writing, by the write driver, the value to the plurality of global input/output lines in response to the activation signal received on a local activation input of the write driver and regardless of a data input received on a data input line of the write driver.

17. The method of claim 15, wherein writing the value to the plurality of global input/output lines comprises setting, by a latch circuit, a data input of the write driver to a value in response to the activation signal.

18. The method of claim 15, further comprising generating the activation signal by an address command decoder.

19. The method of claim 15, further comprising generating the activation signal by setting a mode register of the memory device.

20. A memory device for clearing a page of memory, the memory device comprising:
   means for selecting a row of memory cells of a memory tile of the memory device based on a memory address;
   means for selecting every column of memory cells of the selected row of memory cells of the memory tile in response to an activation signal; and
   means for writing a value to a plurality of global input/output lines to write the value to each of the memory cells of the selected row and the selected columns regardless of a data input received by a write driver of the memory device.

21. The memory device of claim 20, wherein the means for writing the value to the plurality of global input/output lines comprises means for writing the value to the plurality of global input/output lines in response to the activation signal received on a local activation input of the write driver and regardless of a data input received on a data input line of the write driver.

22. The memory device of claim 20, wherein the means for writing the value to the plurality of global input/output lines comprises means for setting a data input of the write driver to a value in response to the activation signal.

23. The memory device of claim 20, further comprising means for generating the activation signal.

* * * * *